United States Patent
Yang et al.

(10) Patent No.: US 12,424,163 B2
(45) Date of Patent: Sep. 23, 2025

(54) DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Zhongliu Yang, Beijing (CN); Hong Yi, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/025,431

(22) PCT Filed: May 31, 2022

(86) PCT No.: PCT/CN2022/096218
§ 371 (c)(1),
(2) Date: Mar. 9, 2023

(87) PCT Pub. No.: WO2023/230833
PCT Pub. Date: Dec. 7, 2023

(65) Prior Publication Data
US 2024/0296792 A1  Sep. 5, 2024

(51) Int. Cl.
*G09G 3/3233* (2016.01)
(52) U.S. Cl.
CPC ... *G09G 3/3233* (2013.01); *G09G 2300/0426* (2013.01); *G09G 2300/0819* (2013.01);
(Continued)
(58) Field of Classification Search
CPC ......... G09G 3/3233; G09G 2300/0426; G09G 2300/0819; G09G 2300/0842;
(Continued)

(56) References Cited

U.S. PATENT DOCUMENTS

| 5,598,283 A | 1/1997 | Fujii et al. |
| 11,195,895 B2 | 12/2021 | Yi |

(Continued)

FOREIGN PATENT DOCUMENTS

| CN | 108520893 A | 9/2018 |
| CN | 109326628 A | 2/2019 |

(Continued)

OTHER PUBLICATIONS

International Search Report in PCT/CN2022/096218 in Chinese, mailed Aug. 17, 2022.

(Continued)

*Primary Examiner* — Matthew A Eason
*Assistant Examiner* — Chayce R Bibbee
(74) *Attorney, Agent, or Firm* — Collard & Roe, P.C.

(57) ABSTRACT

Provided are a display panel and a display device. The display panel includes: a base substrate, including a display region and a peripheral region, the peripheral region being located on at least one side of the display region; a plurality of sub-pixels, located in the display region; a plurality of constant voltage lines, arranged in a first direction, each of the plurality of constant voltage lines extending in a second direction, the constant voltage line being at least partially located in the display region, and the first direction intersecting with the second direction; and a conductive line, located in the peripheral region, and connected with the plurality of constant voltage lines, the plurality of constant voltage lines being configured to provide a constant voltage to the plurality of sub-pixels.

20 Claims, 24 Drawing Sheets

(52) U.S. Cl.
CPC ............ *G09G 2300/0842* (2013.01); *G09G 2300/0861* (2013.01); *G09G 2310/0286* (2013.01); *G09G 2320/0247* (2013.01)

(58) Field of Classification Search
CPC ... G09G 2300/0861; G09G 2310/0286; G09G 2320/0247
See application file for complete search history.

(56) References Cited

U.S. PATENT DOCUMENTS

| | | |
|---|---|---|
| 11,210,978 B2 | 12/2021 | Im et al. |
| 11,404,521 B2 | 8/2022 | Moon et al. |
| 2015/0187279 A1* | 7/2015 | Lee .................. H10K 59/131 438/23 |
| 2017/0288008 A1 | 10/2017 | Kim et al. |
| 2019/0027090 A1 | 1/2019 | Nonaka et al. |
| 2019/0074344 A1 | 3/2019 | Ka et al. |
| 2020/0226978 A1* | 7/2020 | Lin .................... H01L 29/7869 |
| 2020/0303421 A1 | 9/2020 | Cho et al. |
| 2021/0097928 A1* | 4/2021 | Yoon .................. H05K 9/0067 |
| 2021/0118343 A1* | 4/2021 | Im .................... G09G 3/3291 |
| 2021/0384466 A1 | 12/2021 | Liu et al. |
| 2022/0069044 A1 | 3/2022 | Kwak et al. |
| 2022/0172678 A1 | 6/2022 | Lee et al. |
| 2022/0285649 A1 | 9/2022 | Kim et al. |
| 2022/0310010 A1 | 9/2022 | Cheng et al. |
| 2023/0060545 A1 | 3/2023 | Du et al. |

FOREIGN PATENT DOCUMENTS

| | | |
|---|---|---|
| CN | 110277506 A | 9/2019 |
| CN | 110718577 A | 1/2020 |
| CN | 111128080 A | 5/2020 |
| CN | 112599567 A | 4/2021 |
| CN | 112701143 A | 4/2021 |
| CN | 114255703 A | 3/2022 |
| JP | H07-013185 A | 1/1995 |

OTHER PUBLICATIONS

Extended European Search Report in European Applcation No. 22944170.4 dated Jun. 20, 2025.

* cited by examiner

DISPLAY PANEL AND DISPLAY DEVICE

CROSS REFERENCE TO RELATED APPLICATIONS

This application is the National Stage of PCT/CN2022/096218 filed on May 31, 2022, the disclosure of which is incorporated by reference.

TECHNICAL FIELD

At least one embodiment of the present disclosure relates to a display panel and a display device.

BACKGROUND

In recent years, with the development of display technology, the organic light-emitting diode (OLED) display is one of the hot spots in the research field of flat panel display, and more and more active matrix organic light-emitting diode (AMOLED) display panels have entered the market. Compared with thin film transistor liquid crystal display (TFT-LCD), AMOLED has faster responding speed, higher contrast, and wider viewing angle.

In order to improve the display effect, engineers are constantly looking for more optimized pixel circuit design.

SUMMARY

At least one embodiment of the present disclosure relates to a display panel and a display device.

At least one embodiment of the present disclosure provides a display panel, including: a base substrate, including a display region and a peripheral region, the peripheral region being located on at least one side of the display region; a plurality of sub-pixels, located in the display region; a plurality of constant voltage lines, arranged in a first direction, each of the plurality of constant voltage lines extending in a second direction, the constant voltage line is at least partially located in the display region, and the first direction intersecting with the second direction; and a conductive line, located in the peripheral region, and connected with the plurality of constant voltage lines, the plurality of constant voltage lines are configured to provide a constant voltage to the plurality of sub-pixels.

For example, the display panel further includes a first power line, the first power line is configured to provide a constant first power voltage to the plurality of sub-pixels, the first power line includes a first power bus, the first power bus is located in the peripheral region, and at least a part of the first power bus extends in the second direction.

For example, the display panel further includes a second power line, the second power line is configured to provide a constant second power voltage to the plurality of sub-pixels, the second power line includes a second power bus, the second power bus is located in the peripheral region, and at least a part of the second power bus extends in the second direction.

For example, the conductive line includes a conductive bus, at least a part of the conductive bus extends in the second direction, and the at least a part of the conductive bus extending in the second direction is located between the at least a part of the first power bus extending in the second direction and the at least a part of the second power bus extending in the second direction.

For example, the display panel further includes an integrated circuit, the conductive bus, the first power bus, and the second power bus are all connected with the integrated circuit.

For example, the conductive line includes a first branch and a second branch that are connected with the conductive bus, respectively, the first power line includes a first power connection line, the first power connection line extends in the first direction, and an orthographic projection of the first power connection line on the base substrate overlaps with an orthographic projection of the first branch on the base substrate.

For example, the display panel further includes a planarization layer, the planarization layer is located at one side of the first branch close to the base substrate, the first branch has a plurality of openings, and each of the plurality of openings is configured to expose a part of the planarization layer.

For example, a material of the planarization layer includes an organic material.

For example, the first branch extends in the first direction, an included angle between the second branch and the first branch is an obtuse angle, and an included angle between the second branch and the conductive bus is an obtuse angle.

For example, a shape of the second branch includes at least one of an arc, a curve, or a fold line.

For example, the display panel further includes a plurality of conductive connection lines, the second branch is connected with the plurality of conductive connection lines, and part of the plurality of constant voltage lines are connected with the plurality of conductive connection lines, respectively.

For example, the display panel further includes a plurality of signal connection lines, an orthographic projection of at least a part of the plurality of signal connection lines on the base substrate overlaps with an orthographic projection of the second branch on the base substrate.

For example, at least one signal connection line of the plurality of signal connection lines is arranged between two adjacent conductive connection lines.

For example, each of the plurality of signal connection lines includes at least one of a clock signal line, a start input signal line of a shift register, a low-level signal line, or a high-level signal line.

For example, the plurality of constant voltage lines, at least a part of the conductive bus, and the second branch are located in a same layer, and the first branch is located in another layer.

For example, each of the plurality of sub-pixels includes a pixel circuit and a light-emitting element, the pixel circuit is configured to drive the light-emitting element, the pixel circuit includes a reset transistor, a first electrode of the reset transistor is connected with an initialization line, a second electrode of the reset transistor is connected with a first electrode of the light-emitting element, the reset transistor is configured to reset the first electrode of the light-emitting element, and the constant voltage line is the initialization line.

For example, each of the plurality of sub-pixels includes a pixel circuit and a light-emitting element, the pixel circuit is configured to drive the light-emitting element, and the pixel circuit includes a driving transistor, a first reset transistor, and a second reset transistor, a first electrode of the first reset transistor is connected with a first initialization line, a second electrode of the first reset transistor is connected with a gate electrode of the driving transistor, and the first reset transistor is configured to reset the gate electrode of the driving transistor, a first electrode of the second reset transistor is connected with a second initialization line, a second electrode of the second reset transistor is connected with a first electrode of the light-emitting element, and the second reset transistor is configured to reset the first electrode of the light-emitting element.

For example, the display panel further includes an initialization signal line, the initialization signal line extends in the first direction, the constant voltage line is connected with the initialization signal line, and the second initialization line includes the initialization signal line and the constant voltage line which are connected with each other.

For example, the pixel circuit includes a compensation transistor and an anti-leakage transistor, a gate electrode of the compensation transistor is configured to receive a compensation control signal, a first electrode of the compensation transistor is connected with the gate electrode of the driving transistor, and a second electrode of the compensation transistor is electrically connected with a second electrode of the driving transistor; the compensation transistor includes a first compensation sub-transistor and a second compensation sub-transistor which are connected in series, and the first compensation sub-transistor and the second compensation sub-transistor are connected through an intermediate node therebetween; a first electrode of the anti-leakage transistor is connected with a reference voltage line, and a second electrode of the anti-leakage transistor is connected with the intermediate node, and the constant voltage line is the reference voltage line.

At least one embodiment of the present disclosure provides a display device, including any one of the display panels as described above.

BRIEF DESCRIPTION OF DRAWINGS

In order to clearly illustrate the technical solution of the embodiments of the present disclosure, the drawings of the embodiments will be briefly described in the following; it is obvious that the described drawings are only related to some embodiments of the present disclosure and thus are not construed as any limitation to the present disclosure.

DETAILED DESCRIPTION

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise." "comprising." "include," "including." etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On." "under," "right." "left" and the like are only used to indicate relative position relationship, and when the position of the described object is changed, the relative position relationship may be changed accordingly.

Figure 1:
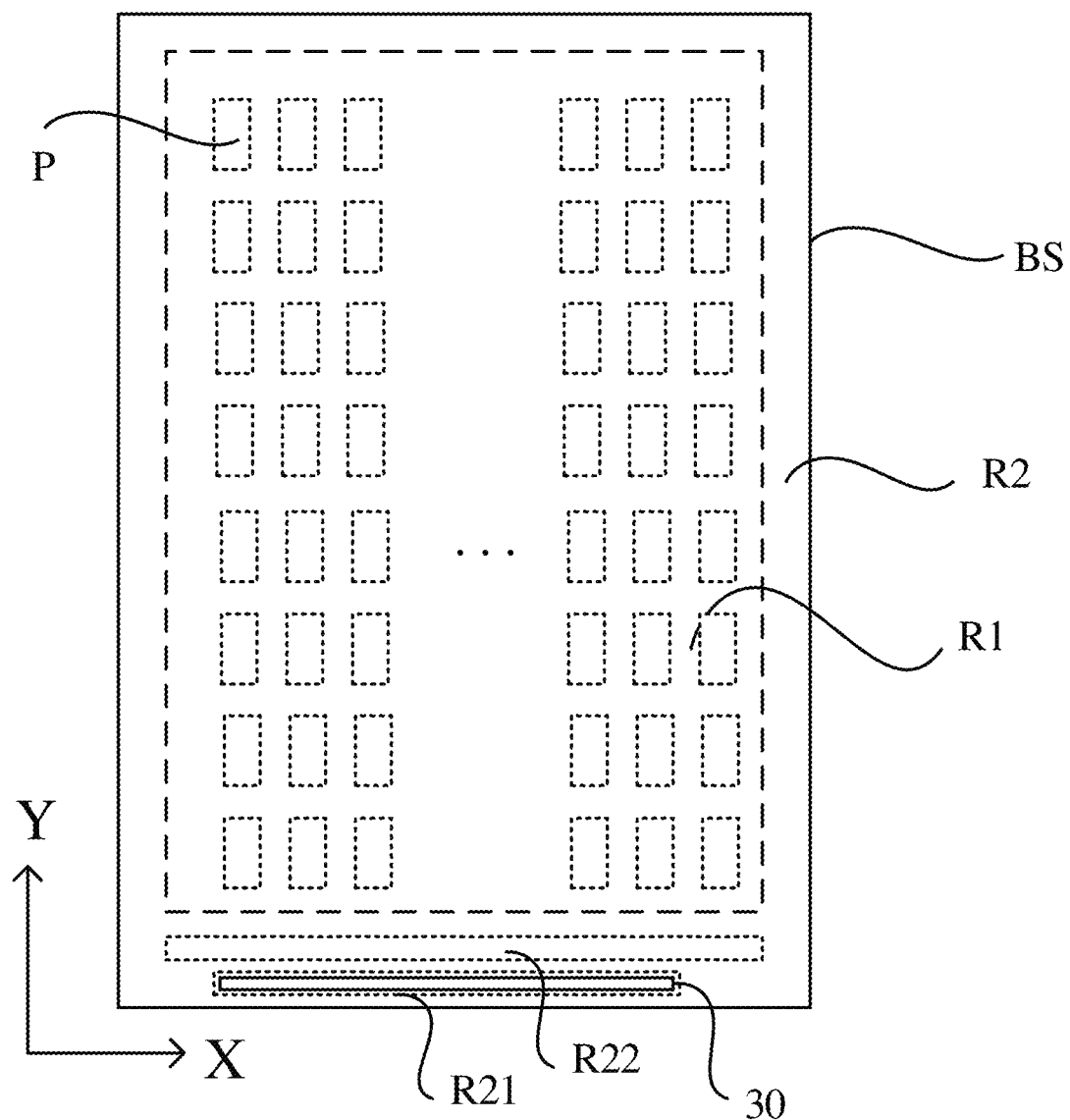
FIG. 1 is a schematic diagram of a display panel.

FIG. 1 is a schematic diagram of a display panel. As illustrated in FIG. 1, the display panel includes a base substrate BS. The base substrate BS includes a display region R1 and a peripheral region R2, and the peripheral region R2 is located on at least one side of the display region R1. As illustrated in FIG. 1, the peripheral region R2 is provided on the upper side, the lower side, the left side, and the right side of the display region R1, and FIG. 1 is illustrated by taking that the peripheral region R2 surrounds the display region R1 as an example.

In the embodiments of the present disclosure, a first direction X and a second direction Y are illustrated in a plan view, and a third direction Z is illustrated in a cross-sectional view. The first direction X and the second direction Y are directions parallel to the main surface of the base substrate BS, and the third direction Z is a direction perpendicular to the main surface of the base substrate BS. The first direction X intersects with the second direction Y. The embodiments of the present disclosure are illustrated by taking that the first direction X is perpendicular to the second direction Y as an example.

As illustrated in FIG. 1, the peripheral region is provided with an integrated circuit 30. The integrated circuit 30 is located in the peripheral region R2. The region where the integrated circuit 30 is disposed is an integrated circuit arranging region R21.

As illustrated in FIG. 1, the peripheral region R2 can further be provided with a bending region R22. In order to narrow the frame of the display panel, the integrated circuit 30 can be located at the back side of the base substrate by bending. Of course, the display panel may not be provided with the bending region R22.

As illustrated in FIG. 1, the display panel includes a plurality of sub-pixels P, and the plurality of sub-pixels P are located in the display region R1. FIG. 1 illustrates some sub-pixels P in the display panel, and the number of sub-pixels P in the display panel can be determined as needed. For example, in some embodiments, the plurality of sub-pixels P can be arranged in an array, but it is not limited to this case, and the arrangement manner of the plurality of sub-pixels P can be determined as needed.

Figure 2:
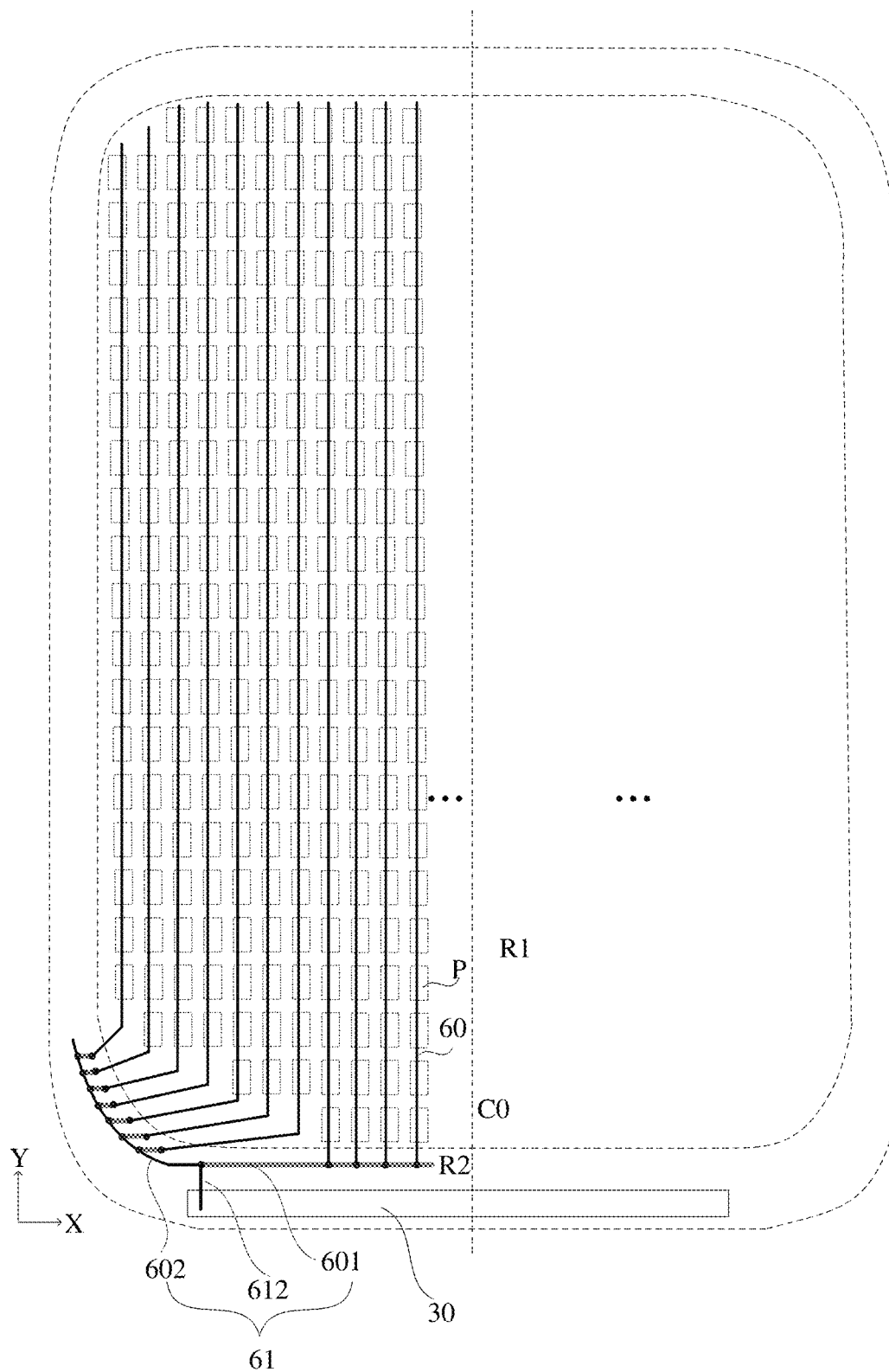
FIG. 2 is a schematic diagram of a display panel provided by an embodiment of the present disclosure.
Figure 3:
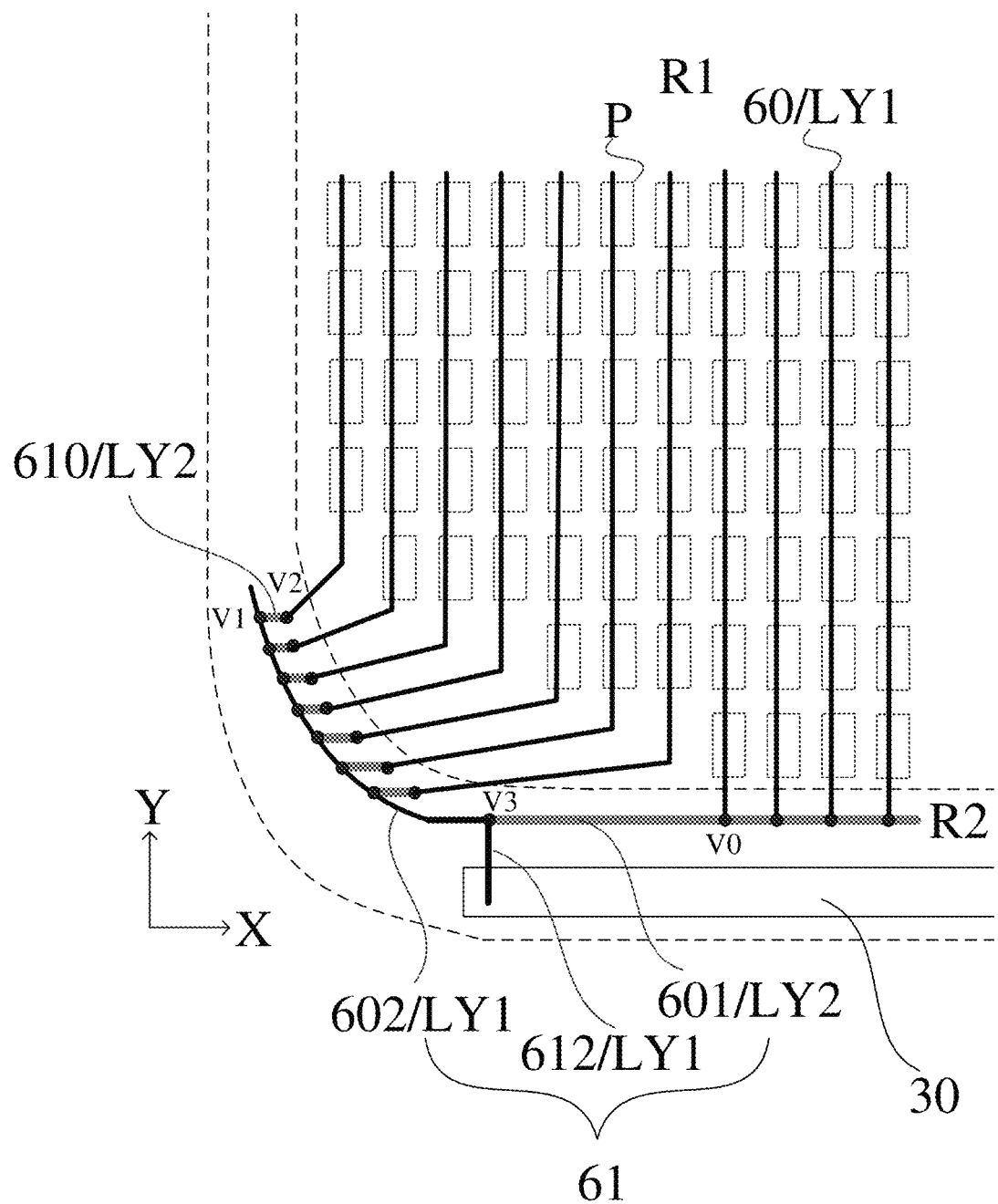
FIG. 3 is an enlarged view of the lower left corner of FIG. 2.

FIG. 2 is a schematic diagram of a display panel provided by an embodiment of the present disclosure. FIG. 3 is an enlarged view of the lower left corner of FIG. 2.

As illustrated in FIG. 2 and FIG. 3, the display panel includes a conductive line 61 and a plurality of constant voltage lines 60. The constant voltage line 60 is configured to provide a constant voltage to the sub-pixel; the conductive line 61 is located in the peripheral region R2 and connected with the plurality of constant voltage lines 60. The constant voltage line 60 can also be referred to as a static level input line. The static level input line is configured to provide a static level to the sub-pixels P.

As illustrated in FIG. 2 and FIG. 3, the plurality of constant voltage lines 60 are arranged in the first direction X. FIG. 2 does not illustrate all of the constant voltage lines 60, and the number of the constant voltage lines 60 is not limited to that illustrated in the figure, but can be determined as needed.

As illustrated in FIG. 2, the display panel has a center line C0, and the center line C0 extends in the second direction. The left half and the right half of the display panel are symmetrically arranged with respect to the center line C0. For the sake of clarity, FIG. 2 does not illustrate the wiring distribution structure in the right half relative to the center line C0, and does not illustrate all of the wiring distribution in the left half relative to the center line C0.

As illustrated in FIG. 2 and FIG. 3, the constant voltage line 60 extends in the second direction Y, and the first direction X intersects with the second direction Y.

In the embodiment of the present disclosure, a component extends in one direction, referring to that this direction is an extending direction of the general trend of the component. It is not required that every part of the component extends in this direction, and it is not limited that the component has a straight-line shape. For example, the component can have a fold line shape. For example, the extending direction of a component can refer to the extending direction of the length of the component.

As illustrated in FIG. 2 and FIG. 3, the conductive line 61 includes a conductive bus 612, and a first branch 601 and a second branch 602 which are connected with the conductive bus 612, respectively.

In the display panel provided by the embodiment of the present disclosure, by providing the conductive line 61 to have the first branch 601 and the second branch 602, it is helpful to improve the signal uniformity on the constant voltage line 60, and helpful to improve the display effect.

For example, as illustrated in FIG. 2 and FIG. 3, the conductive bus 612 extends in the second direction Y, and the first branch 601 extends in the first direction X.

As illustrated in FIG. 2 and FIG. 3, the first branch 601 and the second branch 602 are disposed on opposite sides of the conductive bus 612. The first branch 601 extends from a position close to the conductive bus 612 to a position away from the conductive bus 612, and the second branch 602 extends from a position close to the conductive bus 612 to a position away from the conductive bus 612.

For example, as illustrated in FIG. 2 and FIG. 3, the included angle between the second branch 602 and the first branch 601 is an obtuse angle, and the included angle between the second branch 602 and the conductive bus 612 is an obtuse angle.

For example, the shape of the second branch 602 includes at least one of an arc, a curve, or a fold line. FIG. 2 and FIG. 3 are illustrated by taking that the shape of the second branch 602 is an arc as an example.

As illustrated in FIG. 2, the display panel has a rounded rectangular shape. As illustrated in FIG. 2 and FIG. 3, the second branch 602 is located at a rounded corner of the display panel. FIG. 2 and FIG. 3 illustrate the second branch 602 at the lower left rounded corner of the display panel. The shape of the second branch 602 can be the same as the shape of the edge of the display panel close to the second branch 602.

As illustrated in FIG. 2, the length of the second branch 602 is less than the length of the first branch 601. The length of the second branch 602 is greater than the length of the conductive bus 612.

For example, as illustrated in FIG. 2 and FIG. 3, the display panel further includes an integrated circuit 30, and the conductive bus 612 is connected with the integrated circuit 30. Because the conductive bus 612 is connected with the constant voltage lines 60, the constant voltage lines 60 are connected with the integrated circuit 30.

For example, as illustrated in FIG. 3, the display panel further includes a plurality of conductive connection lines 610, the second branch 602 is connected with the plurality of conductive connection lines 610, and part of the plurality of constant voltage lines 60 are connected with the plurality of conductive connection lines 610, respectively.

As illustrated in FIG. 3, the plurality of constant voltage lines 60, the conductive bus 612, and the second branch 602 are located in the same layer, and the first branch 601 is located in another layer. For example, the plurality of constant voltage lines 60, the conductive bus 612, and the second branch 602 are located in a conductive layer LY1, and the first branch 601 is located in a conductive layer LY2.

For example, as illustrated in FIG. 3, the plurality of conductive connection lines 610 are located in the conductive layer LY2. The first branch 601 and the plurality of conductive connection lines 610 are both located in the conductive layer LY2.

FIG. 3 illustrates a via hole V0. For example, as illustrated in FIG. 3, part of the plurality of constant voltage lines 60 are connected with the first branch 601, and each constant voltage line 60 is connected with the first branch 601 through a via hole V0.

FIG. 3 illustrates a via hole V1 and a via hole V2. Part of the plurality of constant voltage lines 60 are connected with the second branch 602. For example, as illustrated in FIG. 3, both ends of the conductive connection line 610 are connected with the second branch 602 and the constant voltage line 60, respectively.

FIG. 3 is illustrated by taking that one conductive connection line 610 is connected with one constant voltage line 60 as an example. In some other embodiments, one conductive connection line 610 can be connected with multiple constant voltage lines 60. That is, one conductive connection line 610 can be connected with at least one constant voltage line 60.

FIG. 3 illustrates a via hole V3. The conductive bus 612 and the second branch 602 are of an integral structure, and are connected with the first branch 601 through the via hole V3. Of course, the conductive bus 612 can also be formed in segments. In this case, a part of the conductive bus 612 and the second branch 602 are of an integral structure.

For example, an insulating layer is provided between the conductive layer LY1 and the conductive layer LY2, and the via hole V0, the via hole V1, the via hole V2, and the via hole V3 are all via holes penetrating the insulating layer between the conductive layer LY1 and the conductive layer LY2.

Figure 4:
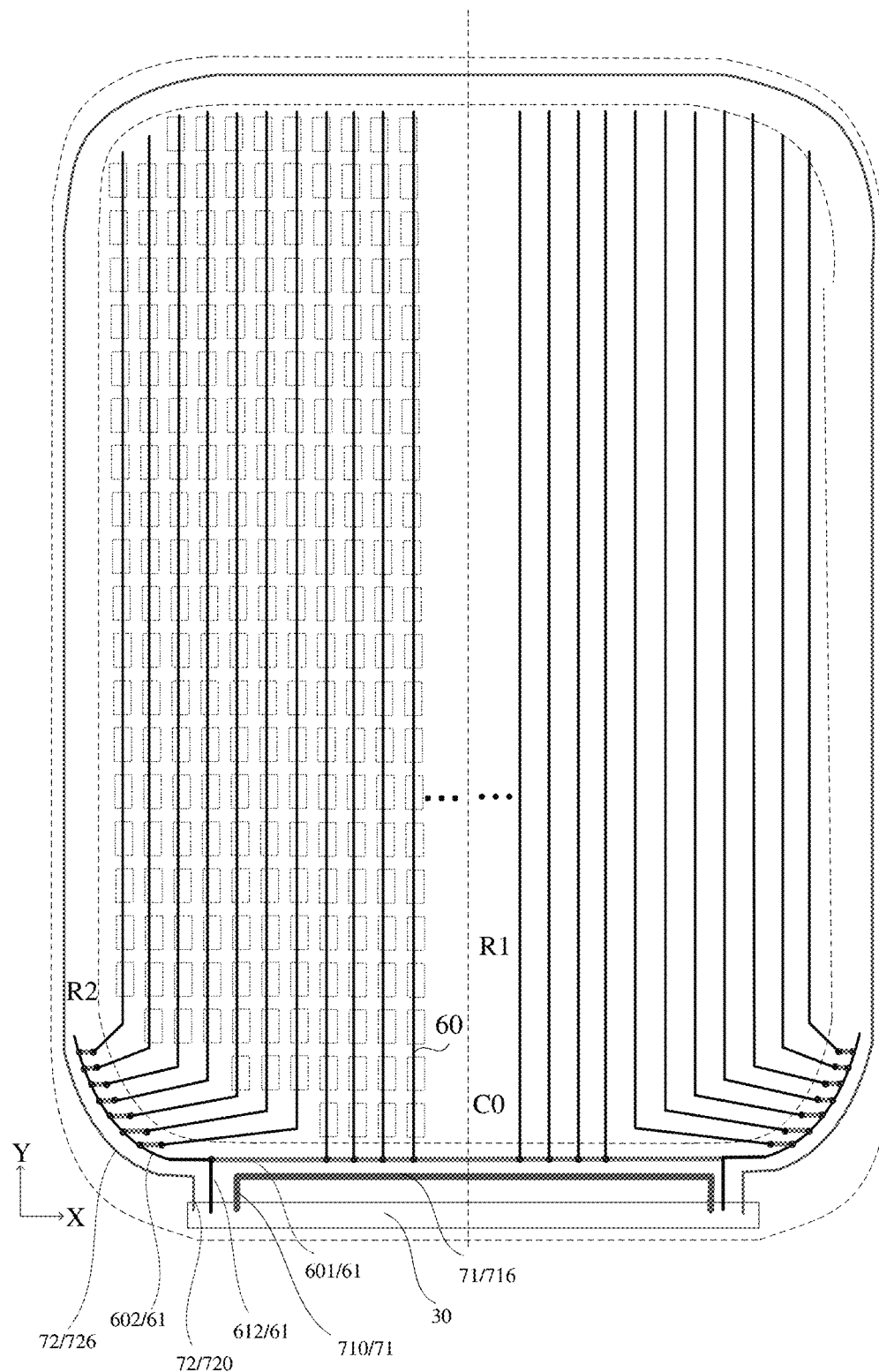
FIG. 4 is a schematic diagram of a display panel provided by an embodiment of the present disclosure.
Figure 5:
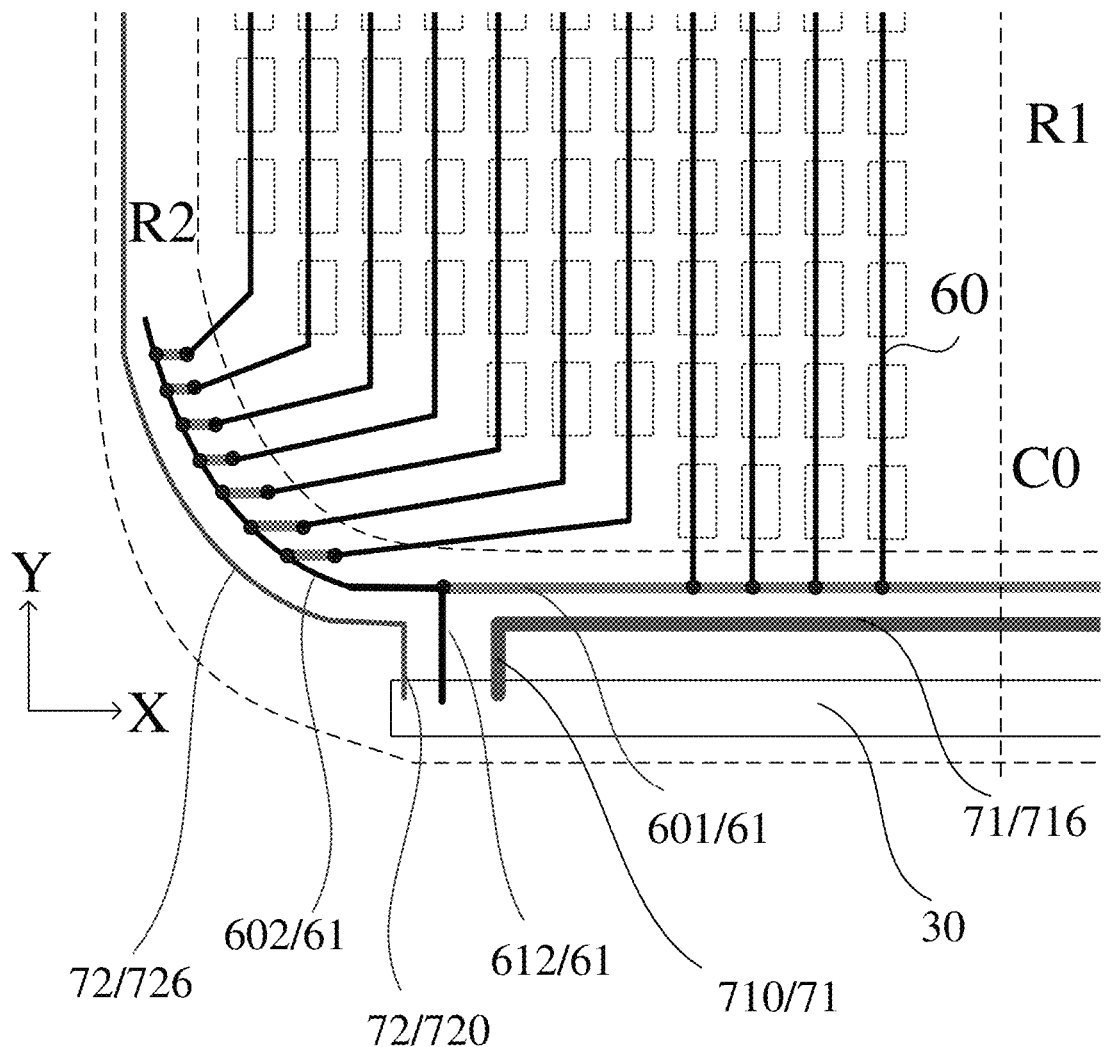
FIG. 5 is an enlarged view of the lower left corner of FIG. 4.

FIG. 4 is a schematic diagram of a display panel provided by an embodiment of the present disclosure. FIG. 5 is an enlarged view of the lower left corner of FIG. 4.

For example, as illustrated in FIG. 4 and FIG. 5, the display panel further includes a first power line 71, the first power line 71 is configured to provide a constant first power voltage to a pixel circuit 1120, the first power line 71 includes a first power bus 710, the first power bus 710 is located in the peripheral region R2, and the first power bus 710 extends in the second direction Y. For example, at least a part of the first power bus 710 extends in the second direction Y.

For example, as illustrated in FIG. 4 and FIG. 5, the display panel further includes a second power line 72, the second power line 72 is configured to provide a constant second power voltage to the sub-pixel P (the pixel circuit of the sub-pixel P), the second power line 72 includes a second power bus 720, the second power bus 720 is located in the peripheral region R2, and the second power bus 720 extends in the second direction Y.

For example, as illustrated in FIG. 4 and FIG. 5, the conductive bus 612 is located between the first power bus 710 and the second power bus 720.

For example, as illustrated in FIG. 4 and FIG. 5, at least a part of the conductive bus 612 extending in the second direction Y is located between at least a part of the first power bus 710 extending in the second direction Y and at least a part of the second power bus 720 extending in the second direction Y.

For example, as illustrated in FIG. 4 and FIG. 5, the conductive bus 612, the first power bus 710 and the second power bus 720 are all connected with the integrated circuit 30.

For example, as illustrated in FIG. 4 and FIG. 5, the first power line 71 includes a first power connection line 716, and the first power connection line 716 extends in the first direction X. FIG. 4 is illustrated by taking that the first power connection line 716 and the first branch 601 are spaced apart in the second direction Y as an example, but the embodiment of the present disclosure is not limited to this case. In some other embodiments, the orthographic projection of the first power connection line 716 on the base substrate BS overlaps with the orthographic projection of the first branch 601 on the base substrate BS.

Figure 6:
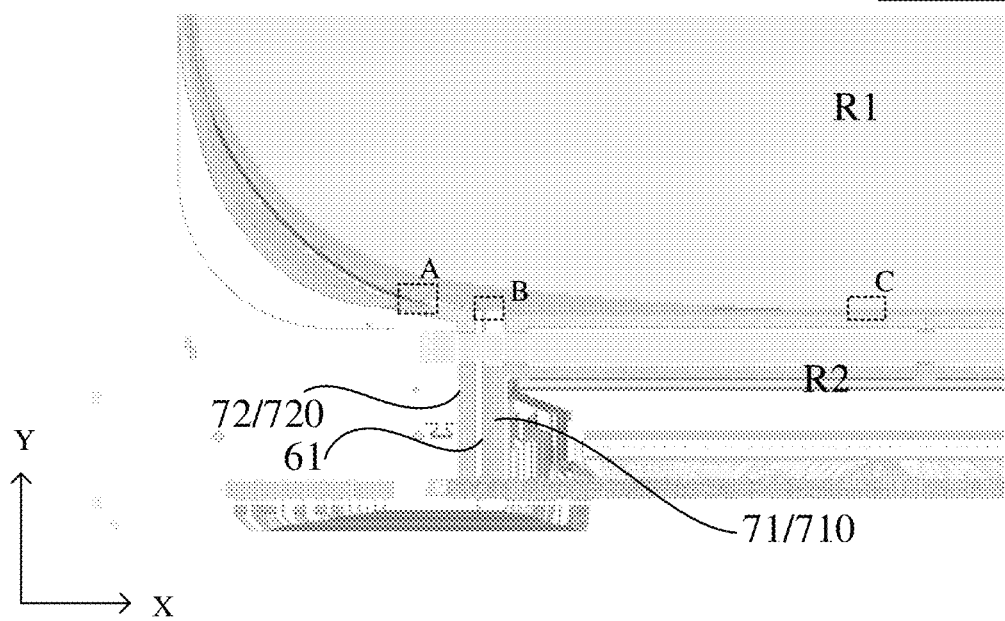
FIG. 6 is a partial view of a stacked layer of a conductive layer LY1 and a conductive layer LY2 in a display panel provided by an embodiment of the present disclosure.
Figure 7:
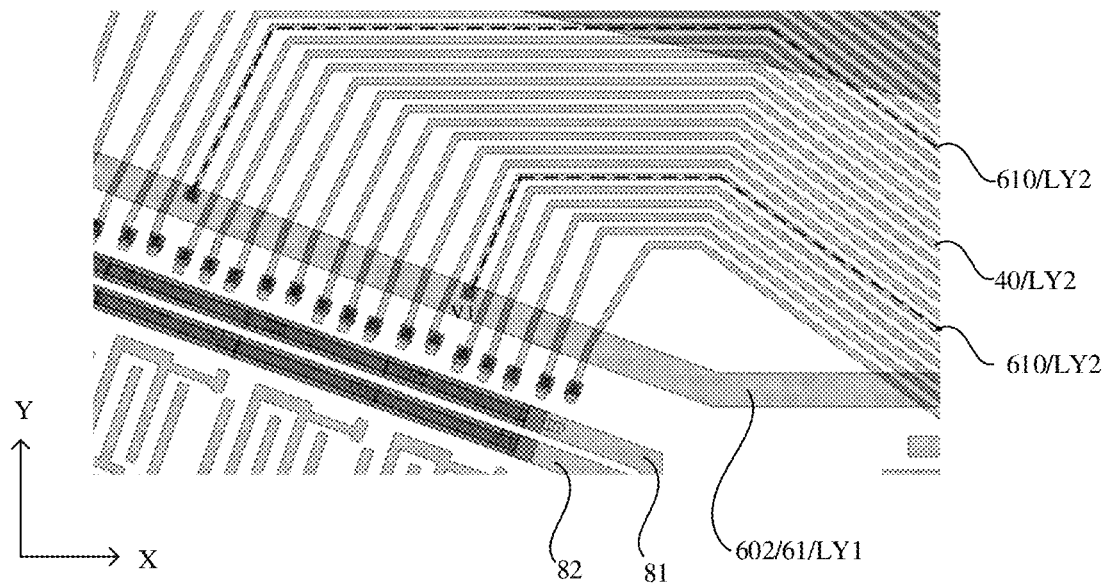
FIG. 7-FIG. 9 are partial views of a stacked layer of a conductive layer LY1 and a conductive layer LY2 in display panels provided by embodiments of the present disclosure.
Figure 8:
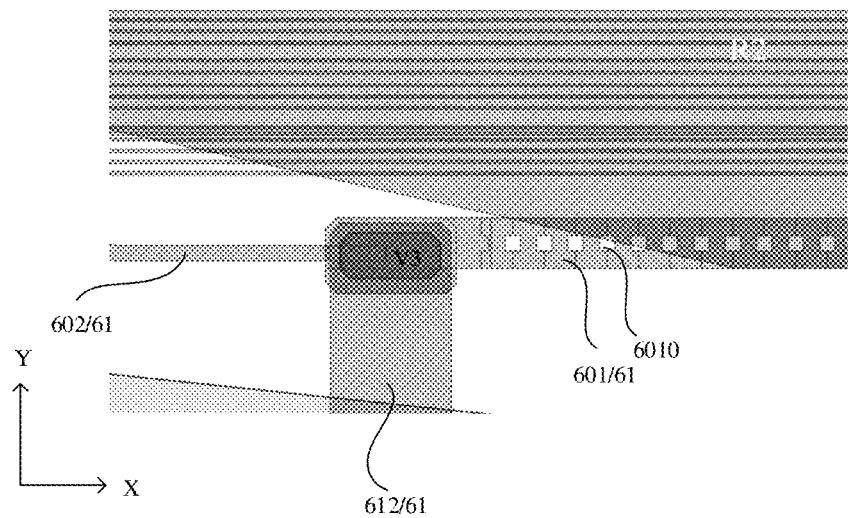
Figure 9:
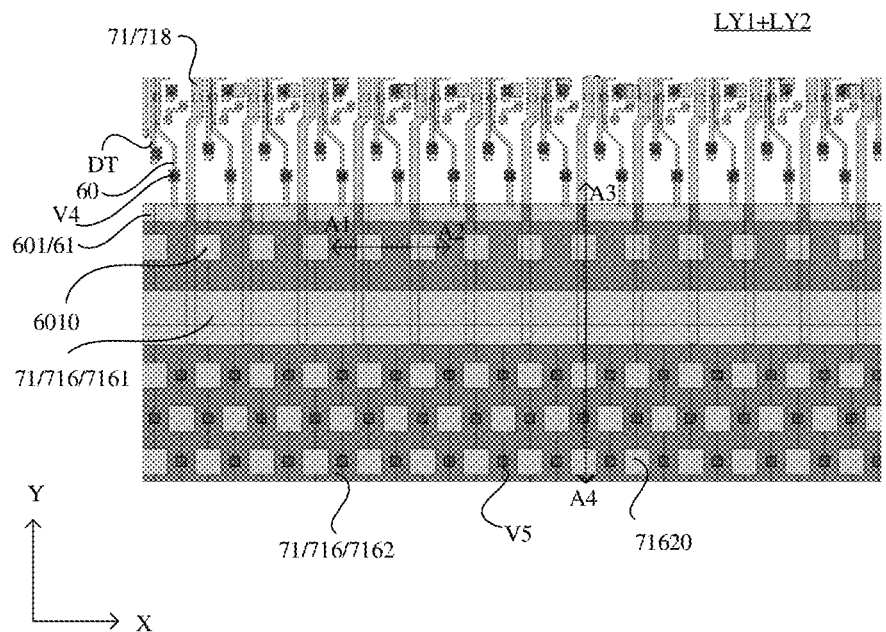

FIG. 6 is a partial view of a stacked layer of a conductive layer LY1 and a conductive layer LY2 in a display panel provided by an embodiment of the present disclosure. FIG. 7-FIG. 9 are partial views of a stacked layer of a conductive layer LY1 and a conductive layer LY2 in display panels provided by embodiments of the present disclosure. FIG. 7-FIG. 9 can be enlarged views at the dashed boxes A, B and C in FIG. 6, respectively.

For example, as illustrated in FIG. 7, the display panel further includes a plurality of signal connection lines 40, and the orthographic projections of at least a part of the plurality of signal connection lines 40 on the base substrate BS overlap with the orthographic projection of the second branch 602 on the base substrate BS. As illustrated in FIG. 7, the plurality of signal connection lines 40 are located in the conductive layer LY2. The signal connection line 40 and the second branch 602 are insulated from each other.

For example, as illustrated in FIG. 7, at least one signal connection line 40 of the plurality of signal connection lines 40 is arranged between two adjacent conductive connection lines 610. FIG. 7 illustrates a conductive connection line 610 with a black dashed line. FIG. 7 illustrates two conductive connection lines 610. FIG. 7 is illustrated by taking that ten signal connection lines 40 are provided between two conductive connection lines 610 as an example, but it is not limited to this case, and the number of signal connection lines 40 between two conductive connection lines 610 can be determined as needed.

For example, the signal connection line 40 includes a signal line of gate driven on array (GOA).

For example, the signal connection line 40 includes at least one of a clock signal line CK or CB, a start input signal line STV of a shift register, a low-level signal line VGL or a high-level signal line VGH.

FIG. 7 illustrates an initialization signal line 81 and an initialization signal line 82. The initialization signal line 81 and the initialization signal line 82 are configured to provide initialization signals to the sub-pixels, respectively.

FIG. 8 illustrates that the first branch 601 has a plurality of openings 6010.

FIG. 8 further illustrates a via hole V3, a second branch, and a conductive bus 612.

FIG. 9 illustrates a first branch 601, an opening 6010 in the first branch 601, and a constant voltage line 60.

As illustrated in FIG. 9, the display panel further includes a first power signal line 718, and the first power signal line 718 is connected with the first power connection line 716.

FIG. 9 further illustrates a data signal line DT. For example, the data signal line DT is configured to provide a data voltage to the sub-pixels.

FIG. 6 is a schematic diagram of the lower left corner of the entire display panel, including a conductive layer LY1 and a conductive layer LY2. The conductive line 61 starts from the integrated circuit, runs in the middle between the first power bus 710 and the second power bus 720, spans the bending region, and runs horizontally to the right (the first branch 601, the conductive layer LY2) and to the upper left (the second branch 602, the conductive layer LY1) at the lower rounded corner. As illustrated in FIG. 7, the second branch 602 is connected with the constant voltage line 60 in the display region at the rounded corner of the display panel through a jumper (a horizontal line, the conductive connection line 610, the conductive layer LY2) located in the conductive layer LY2.

As illustrated in FIG. 7, the second branch 602 located in the conductive layer LY1 is jumped to the conductive connection line 610 located in the conductive layer LY2. The conductive connection line 610 can be disposed in the gap between GOA signal lines.

Figure 10:
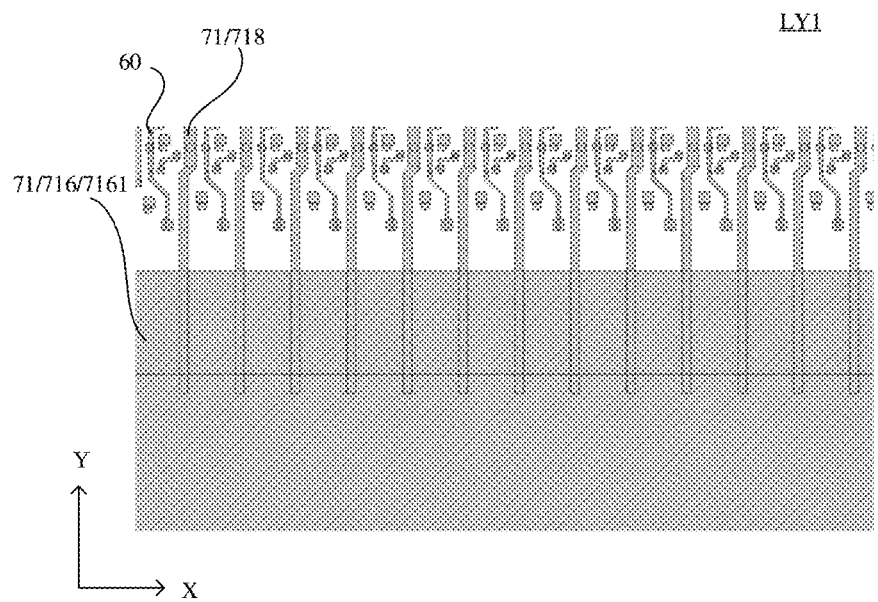
FIG. 10 is a partial plan view of a conductive layer LY1 in a display panel provided by an embodiment of the present disclosure.
Figure 11:
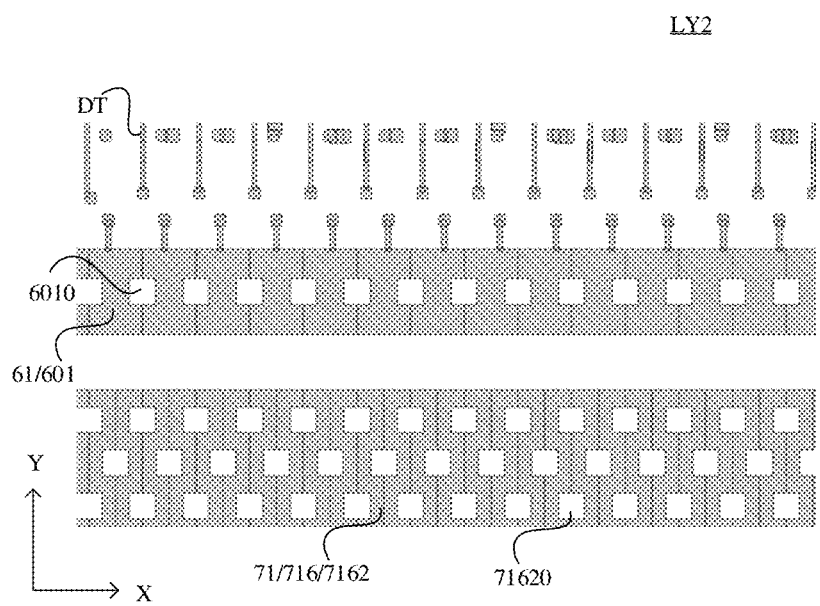
FIG. 11 is a partial plan view of a conductive layer LY2 in a display panel provided by an embodiment of the present disclosure.
Figure 12:
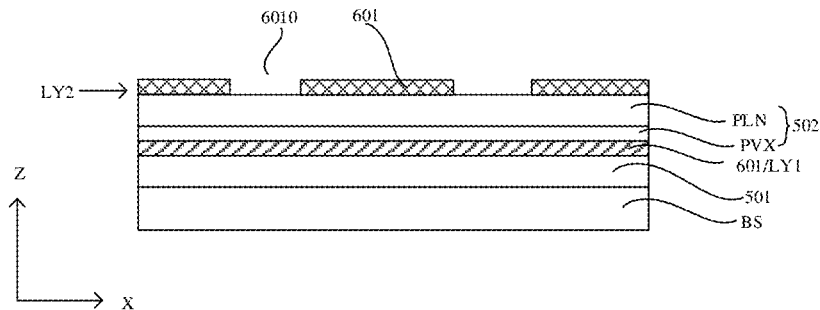
FIG. 12 is a cross-sectional view taken along line A1-A2 of FIG. 9.
Figure 13:
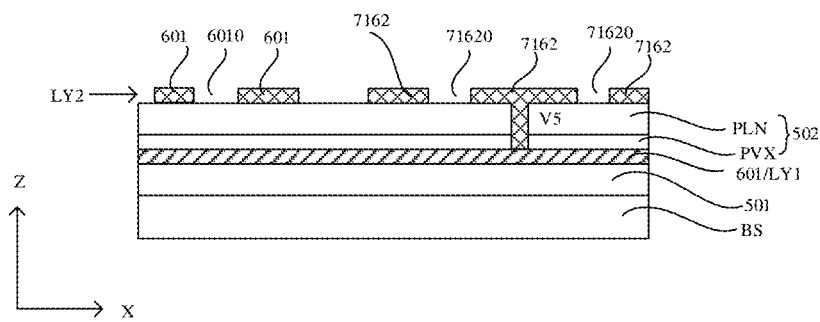
FIG. 13 is a cross-sectional view taken along line A3-A4 of FIG. 9.

FIG. 10 is a partial plan view of a conductive layer LY1 in a display panel provided by an embodiment of the present disclosure. FIG. 11 is a partial plan view of a conductive layer LY2 in a display panel provided by an embodiment of the present disclosure. For example, FIG. 10 can be a plan view of the conductive layer LY1 in the display panel as illustrated in FIG. 9. FIG. 11 can be a plan view of the conductive layer LY2 in the display panel as illustrated in FIG. 9. FIG. 12 is a cross-sectional view taken along line A1-A2 of FIG. 9. FIG. 13 is a cross-sectional view taken along line A3-A4 of FIG. 9.

As illustrated in FIG. 10, the plurality of first power signal lines 718 are arranged in the first direction X, each first power signal line 718 extends in the second direction Y, and the plurality of first power signal lines 718 are connected with the first power connection line 716.

As illustrated in FIG. 10, the constant voltage line 60 is located between two adjacent first power signal lines 718.

Referring to FIG. 9-FIG. 11, the constant voltage line 60 is connected with the first branch 601 through a via hole V4. The via hole V4 is a via hole penetrating the insulating layer between the conductive layer LY1 and the conductive layer LY2.

Referring to FIG. 9-FIG. 11, the first power connection line 716 includes a first power connection portion 7161 and a second power connection portion 7162, and the first power connection portion 7161 and the second power connection portion 7162 are connected with each other. Referring to FIG. 9-FIG. 11, the first power connection portion 7161 and the second power connection portion 7162 are connected through a via hole V5. The via hole V5 is a via hole penetrating the insulating layer between the conductive layer LY1 and the conductive layer LY2.

As illustrated in FIG. 11-FIG. 13, the first branch 601 has a plurality of openings 6010. FIG. 11 is illustrated by taking that the plurality of openings 6010 are sequentially arranged in the first direction X as an example.

As illustrated in FIG. 11-FIG. 13, the second power connection portion 7162 has a plurality of openings 71620. As illustrated in FIG. 11, in order to better provide openings 71620, the plurality of openings 71620 can be evenly distributed. The plurality of openings 71620 can be arranged in a row direction and a column direction, and two adjacent rows of openings 71620 are staggered.

As illustrated in FIG. 11, the largest size of the second power connection portion 7162 in the second direction Y is less than the largest size of the first branch 601 in the second direction Y.

FIG. 9 is a partial view of a stacked layer of a conductive layer LY1 and a conductive layer LY2 in a display panel provided by an embodiment of the present disclosure.

As illustrated in FIG. 12 and FIG. 13, the display panel further includes an insulating layer 501 and an insulating layer 502, the insulating layer 501 is located on the base substrate BS, the conductive layer LY1 is located on the insulating layer 501, the insulating layer 502 is located on the conductive layer LY1, and the conductive layer LY2 is located on the insulating layer 502.

FIG. 12 and FIG. 13 are illustrated by taking that the insulating layer 502 includes a passivation layer PVX and a planarization layer PLN as an example.

For example, the base substrate BS can be a glass substrate, or a polyimide substrate, etc.

For example, both the insulating layer 501 and the insulating layer 502 are made of an insulating material. The insulating material includes an inorganic insulating material and an organic insulating material. For example, the passivation layer PVX is made of an inorganic insulating material, and the planarization layer PLN is made of an organic insulating material. The inorganic insulating material includes at least one of silicon oxide, silicon nitride, or silicon oxynitride, but it is not limited thereto, and can be determined as needed. The organic insulating material includes polyimide, but it is not limited thereto, and can be determined as needed.

For example, as illustrated in FIG. 12 and FIG. 13, the planarization layer PLN is located at one side of the first branch 601 close to the base substrate BS, and the opening 6010 is configured to expose a part of the planarization layer PLN. For example, the material of the planarization layer PLN includes an organic material. At least one of the opening 6010 and the opening 71620 is provided, which is helpful to the release of water vapor in the planarization layer PLN during manufacturing, prevents the water vapor in the planarization layer PLN from entering the display region along the planarization layer PLN, avoids affecting the light-emitting elements, and avoids affecting the display effect. Therefore, the wiring width of the first branch 601 can be made wider, and the wiring impedance can be reduced.

Figure 14:
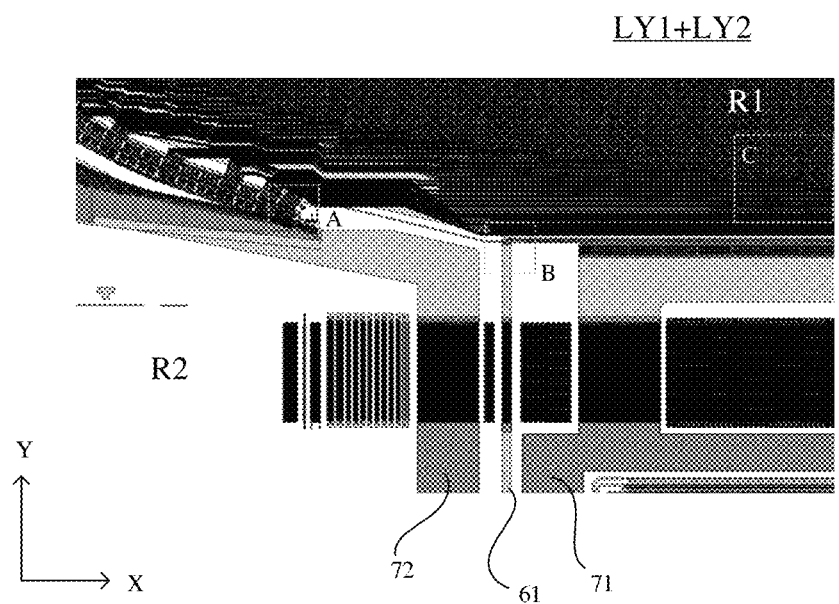
FIG. 14 is a partial view of a stacked layer of a conductive layer LY1 and a conductive layer LY2 in a display panel provided by an embodiment of the present disclosure.
Figure 15:
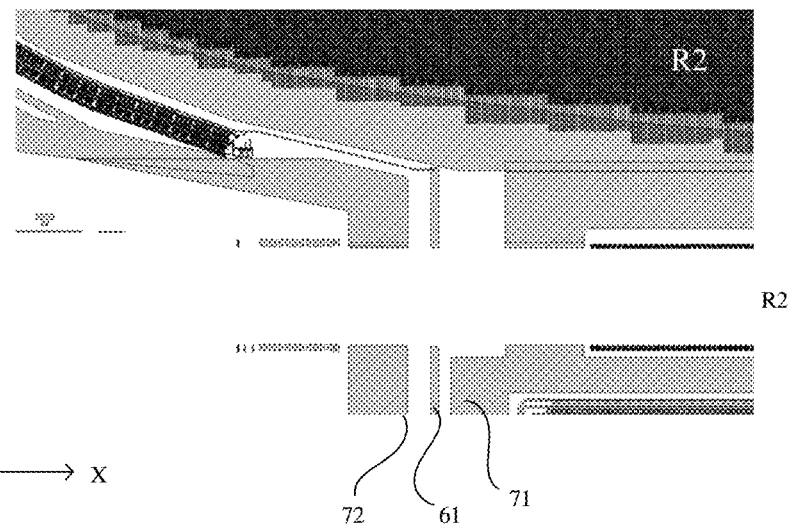
FIG. 15 is a partial plan view of a conductive layer LY1 in a display panel provided by an embodiment of the present disclosure.
Figure 16:
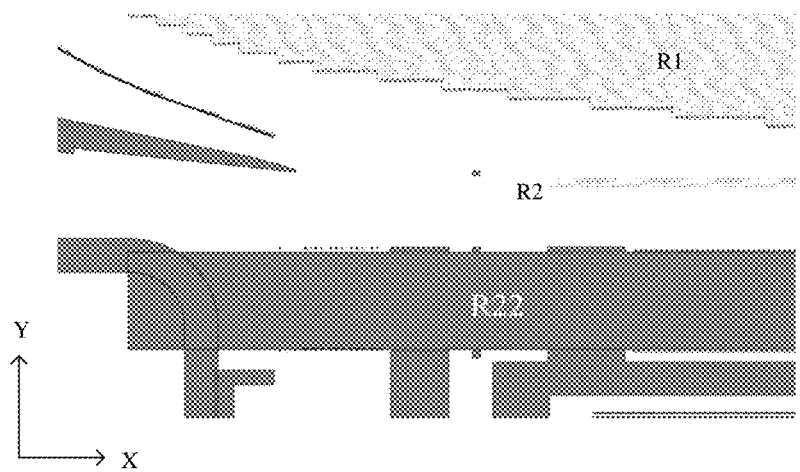
FIG. 16 is a partial plan view of a passivation layer PVX in a display panel provided by an embodiment of the present disclosure.
Figure 17:
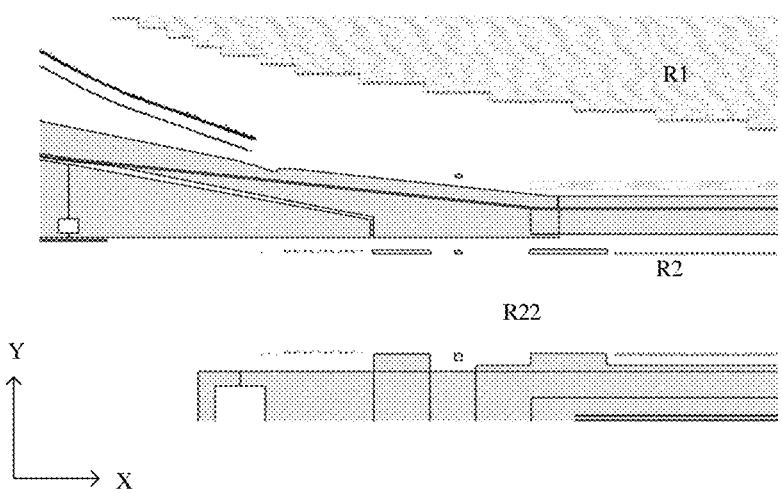
FIG. 17 is a partial plan view of a planarization layer PLN in a display panel provided by an embodiment of the present disclosure.
Figure 18:
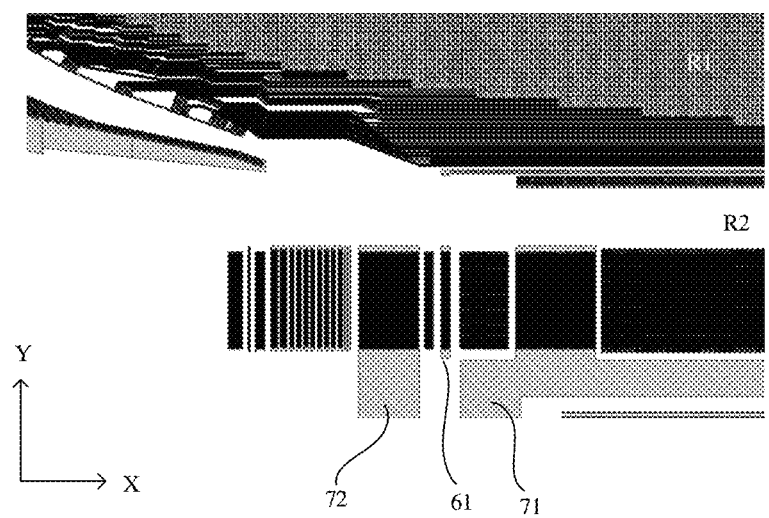
FIG. 18 is a partial plan view of a conductive layer LY2 in a display panel provided by an embodiment of the present disclosure.

FIG. 14 is a partial view of a stacked layer of a conductive layer LY1 and a conductive layer LY2 in a display panel provided by an embodiment of the present disclosure. FIG. 7-FIG. 9 can be enlarged views at the dashed boxes A, B and C in FIG. 14, respectively. FIG. 15 is a partial plan view of a conductive layer LY1 in a display panel provided by an embodiment of the present disclosure. FIG. 16 is a partial plan view of a passivation layer PVX in a display panel provided by an embodiment of the present disclosure. FIG. 17 is a partial plan view of a planarization layer PLN in a display panel provided by an embodiment of the present disclosure. FIG. 18 is a partial plan view of a conductive layer LY2 in a display panel provided by an embodiment of the present disclosure.

FIG. 16 illustrates the passivation layer with the via hole in the passivation layer PVX, that is, the via hole in the passivation layer PVX is illustrated in the figure, and the part not illustrated is the body of the passivation layer PVX. As illustrated in FIG. 16, in the bending region R22, the material of the passivation layer is removed to form a via hole, so as to facilitate bending.

FIG. 17 illustrates the planarization layer with the via hole in the planarization layer PLN, that is, the via hole in the planarization layer PLN is illustrated in the figure, and the part not illustrated is the body of the planarization layer PLN. As illustrated in FIG. 17, in the bending region R22, the material of the planarization layer PLN is reserved, so as to be used as an insulating layer between the conductive layer LY1 and the conductive layer LY2.

As illustrated in FIG. 14-FIG. 18, the conductive bus 612 of the conductive line 61 can be formed in segments, and formed by connecting portions located in different layers through via holes. As illustrated in FIG. 14-FIG. 18, the conductive bus 612 is formed by connecting portions located in the conductive layer LY1 and portions located in the conductive layer LY2 through via holes.

As illustrated in FIG. 14-FIG. 18, the first power bus 710 can be formed in segments, and formed by connecting portions located in different layers through via holes. As illustrated in FIG. 14-FIG. 18, the first power bus 710 is formed by connecting portions located in the conductive layer LY1 and portions located in the conductive layer LY2 through via holes.

As illustrated in FIG. 14-FIG. 18, the second power bus 720 can be formed in segments, and formed by connecting portions located in different layers through via holes. As illustrated in FIG. 14-FIG. 18, the second power bus 720 is formed by connecting portions located in the conductive layer LY1 and portions located in the conductive layer LY2 through via holes.

Figure 19:
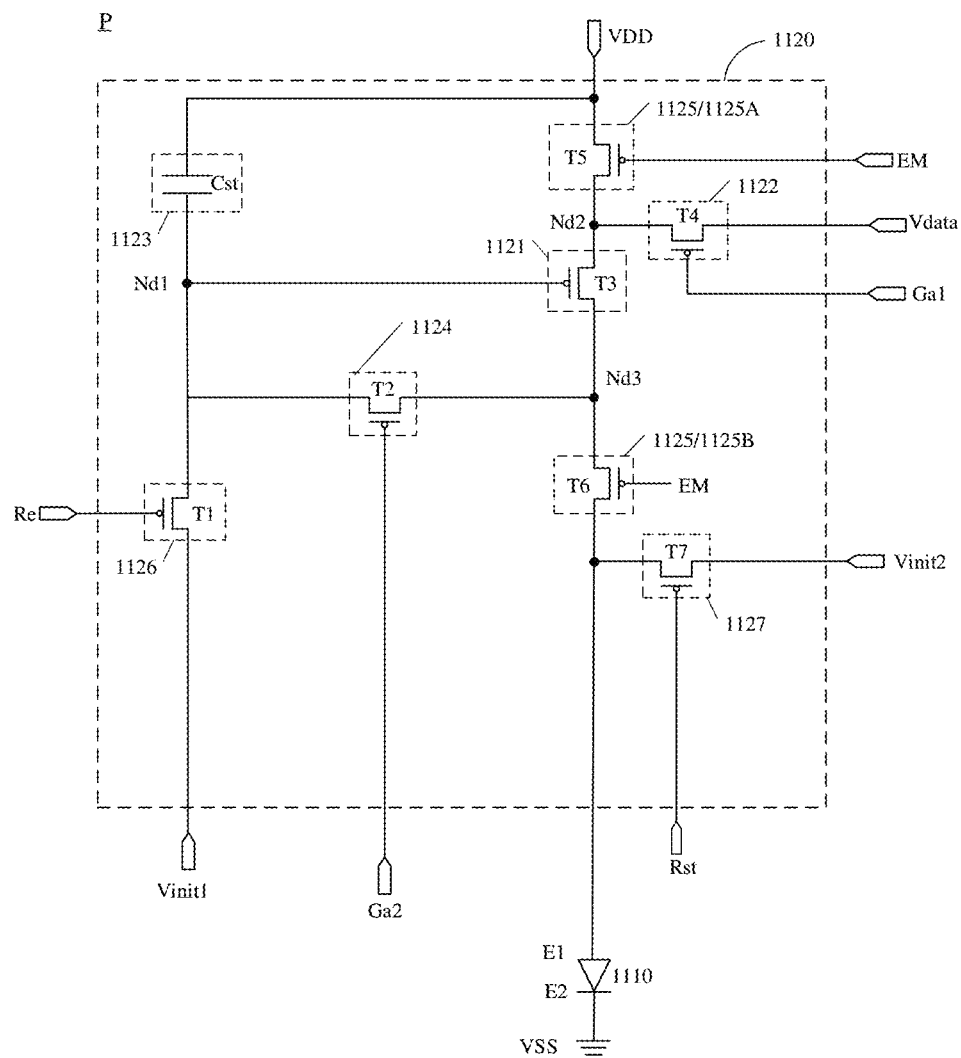
FIG. 19 is a schematic diagram of a pixel circuit and a light-emitting element of a sub-pixel in a display panel provided by some embodiments of the present disclosure.

FIG. 19 is a schematic diagram of a pixel circuit and a light-emitting element of a sub-pixel in a display panel provided by some embodiments of the present disclosure. For example, as illustrated in FIG. 19, the sub-pixel P includes a pixel circuit 1120 and a light-emitting element 1110, and the pixel circuit 1120 is configured to drive the light-emitting element 1110. The constant voltage line 60 is configured to provide a constant voltage to the pixel circuit 1120.

FIG. 19 illustrates a circuit diagram of a pixel circuit of a display substrate provided by some embodiments of the present disclosure. The specific structure of the pixel circuit provided by some embodiments of the present disclosure will be briefly described with reference to FIG. 19.

For example, the plurality of pixel circuits included in the plurality of sub-pixels P are disposed on the base substrate BS, and as illustrated in FIG. 1, are disposed in the display region R1 of the base substrate BS. For example, the gate driving circuit can be configured to output a plurality of output signals to the plurality of pixel circuits, so as to control the plurality of pixel circuits to generate a plurality of driving currents to respectively drive the light-emitting elements in the plurality of sub-pixels P to emit corresponding light, thereby realizing image display.

For example, as illustrated in FIG. 19, each sub-pixel P includes a pixel circuit 1120 and a light-emitting element 1110.

For example, as illustrated in FIG. 19, the pixel circuit 1120 is configured to generate a driving current to control the light-emitting element 1110 to emit light.

For example, the light-emitting element 1110 includes a first electrode E1, a second electrode E2, and a light-emitting functional layer between the first electrode E1 and the second electrode E2. As illustrated in FIG. 19, the first electrode E1 of the light-emitting element 1110 is electrically connected with the pixel circuit 1120, and the second electrode E2 of the light-emitting element 1110 is electrically connected with a voltage terminal VSS. When the driving current generated by the pixel circuit 1120 flows through the light-emitting element 1110, the light-emitting functional layer of the light-emitting element 1110 emits light with brightness corresponding to the magnitude of the driving current.

For example, the light-emitting element 1110 can be a light-emitting diode or the like. The light-emitting diode can be a Micro Light-emitting Diode (Micro LED), an Organic Light-emitting Diode (OLED) or a Quantum Dot Light-emitting Diode (QLED). The light-emitting element 1110 is configured to receive a light-emitting signal (for example, which can be a driving current) and emit light with an intensity corresponding to the light-emitting signal during operation. The first electrode of the light-emitting element 1110 can be an anode, and the second electrode of the light-emitting diode can be a cathode. It should be noted that in the embodiments of the present disclosure, the light-emitting functional layer of the light-emitting element 1110 can include an electroluminescent layer itself and common layers located at both sides of the electroluminescent layer. For example, the common layers can include a hole injection layer, a hole transport layer, an electron injection layer, an electron transport layer and the like. In practical application, the specific structure of the light-emitting element 1110 can be designed and determined according to the actual application environment, which is not limited here. For example, the light-emitting element 1110 has a light-emitting threshold voltage, and the light-emitting element 1110 emits light when the voltage between the first electrode and the second electrode of the light-emitting element 1110 is greater than or equal to the light-emitting threshold voltage.

For example, as illustrated in FIG. 19, the pixel circuit 1120 includes a driving sub-circuit 1121, a data writing sub-circuit 1122, a storage sub-circuit 1123, a compensation sub-circuit 1124, a light-emitting control sub-circuit 1125, a first reset sub-circuit 1126, and a second reset sub-circuit 1127.

For example, the driving sub-circuit 1121 includes a first terminal, a second terminal, and a control terminal, and is configured to generate a driving current for driving the light-emitting element 1110 to emit light. For example, as illustrated in FIG. 19, the control terminal of the driving sub-circuit 1121 is electrically connected with the node Nd1, the first terminal of the driving sub-circuit 1121 is electrically connected with the node Nd2, and the second terminal of the driving sub-circuit 1121 is electrically connected with the node Nd3.

For example, as illustrated in FIG. 19, the data writing sub-circuit 1122 is electrically connected with the first terminal of the driving sub-circuit 1121 (i.e., the node Nd2) and the data signal line, respectively, and is configured to write the data signal Vdata provided by the data signal line into the first terminal of the driving sub-circuit 1121 in response to a scan signal Ga1.

For example, as illustrated in FIG. 19, the storage sub-circuit 1123 is electrically connected with the voltage terminal VDD and the control terminal of the driving sub-circuit 1121 (i.e., the node Nd1), respectively, and is configured to store a compensation signal obtained based on the data signal Vdata.

For example, as illustrated in FIG. 19, the compensation sub-circuit 1124 is electrically connected with the second terminal of the driving sub-circuit 1121 (i.e., the node Nd3) and the node Nd1, respectively, and is configured to perform threshold compensation on the driving sub-circuit 1121 in response to a compensation control signal Ga2. The compensation signal stored in the storage sub-circuit 1123 refers to a signal obtained after threshold compensation.

For example, as illustrated in FIG. 19, the light-emitting control sub-circuit 1125 is electrically connected with the first terminal and the second terminal of the driving sub-circuit 1121, respectively, and is configured to control the driving current generated by the driving sub-circuit 1121 to be transmitted to the light-emitting element 1110 in response to a light-emitting control signal EM. For example, the light-emitting control sub-circuit 1125 includes a first light-emitting control sub-circuit 1125A and a second light-emitting control sub-circuit 1125B. The first light-emitting control sub-circuit 1125A is electrically connected with the first terminal of the driving sub-circuit 1121 (i.e., the node Nd2) and the voltage terminal VDD, and is configured to realize a connection or disconnection between the driving sub-circuit 1121 and the voltage terminal VDD in response to the light-emitting control signal EM. The second light-emitting control sub-circuit 1125B is electrically connected with the second terminal of the driving sub-circuit 1121 (i.e., the node Nd3) and the first electrode E1 of the light-emitting element 1110, respectively, and is configured to realize a connection or disconnection between the driving sub-circuit 1121 and the light-emitting element 1110 (e.g., the first electrode E1 of the light-emitting element 1110) in response to the light-emitting control signal EM.

For example, as illustrated in FIG. 19, the first reset sub-circuit 1126 is electrically connected with the node Nd1 (the control terminal of the driving sub-circuit 1121) and a first initialization voltage terminal Vinit1, respectively, and is configured to reset the control terminal of the driving sub-circuit 1121 (i.e., the node Nd1) in response to a first reset control signal Re. For example, the first reset sub-circuit 1126 can write a first initialization voltage provided by the first initialization voltage terminal Vinit1 into the control terminal of the driving sub-circuit 1121 (i.e., the node Nd1), so as to reset the control terminal of the driving sub-circuit 1121.

For example, as illustrated in FIG. 19, the second reset sub-circuit 1127 is electrically connected with the first electrode of the light-emitting element 1110 and a second initialization voltage terminal Vinit2, respectively, and is configured to reset the first electrode E1 of the light-emitting element 1110 in response to a second reset control signal Rst. For example, the second reset sub-circuit 1127 can write a second initialization voltage provided by the second initialization voltage terminal Vinit2 into the first electrode E1 of the light-emitting element 1110, so as to reset the first electrode E1 of the light-emitting element 1110.

For example, as illustrated in FIG. 19, the driving sub-circuit 1121 includes a driving transistor T3, the control terminal of the driving sub-circuit 1121 includes the gate electrode of the driving transistor T3, the first terminal of the driving sub-circuit 1121 includes the first electrode of the driving transistor T3, and the second terminal of the driving sub-circuit 1121 includes the second electrode of the driving transistor T3.

For example, as illustrated in FIG. 19, the data writing sub-circuit 1122 includes a data writing transistor T4, the gate electrode of the data writing transistor T4 is configured to receive the scan signal Ga1, the first electrode of the data writing transistor T4 is electrically connected with the data signal line, and the second electrode of the data writing transistor T4 is electrically connected with the first electrode of the driving transistor T3, that is, the second electrode of the data writing transistor T4 is electrically connected with the node Nd2.

For example, as illustrated in FIG. 19, the storage sub-circuit 1123 includes a storage capacitor Cst; the first terminal of the storage capacitor Cst is electrically connected with the gate electrode of the driving transistor T3, that is, the first terminal (first electrode-plate) of the storage capacitor Cst is electrically connected with the node Nd1; and the second terminal (second electrode-plate) of the storage capacitor Cst is electrically connected with the voltage terminal VDD.

For example, as illustrated in FIG. 19, the compensation sub-circuit 1124 includes a compensation transistor T2, the gate electrode of the compensation transistor T2 is configured to receive the compensation control signal Ga2; the second electrode of the compensation transistor T2 is electrically connected with the second electrode of the driving transistor T3, that is, the second electrode of the compensation transistor T2 is electrically connected with the node Nd3; and the first electrode of the compensation transistor T2 is electrically connected with the node Nd1.

For example, as illustrated in FIG. 19, the first light-emitting control sub-circuit 1125A includes a first light-emitting control transistor T5, and the second light-emitting control sub-circuit 1125B includes a second light-emitting control transistor T6. For example, the gate electrode of the first light-emitting control transistor T5 is configured to receive the light-emitting control signal EM, the first electrode of the first light-emitting control transistor T5 is connected with the voltage terminal VDD, and the second electrode of the first light-emitting control transistor T5 is electrically connected with the first terminal of the driving sub-circuit 1221, that is, the second electrode of the first light-emitting control transistor T5 is electrically connected with the node Nd2; the gate electrode of the second light-emitting control transistor T6 is configured to receive the light-emitting control signal EM, the first electrode of the second light-emitting control transistor T6 is electrically connected with the second terminal of the driving sub-circuit 1221, that is, the first electrode of the second light-emitting control transistor T6 is electrically connected with the node Nd3, and the second electrode of the second light-emitting control transistor T6 is electrically connected with the first electrode E1 of the light-emitting element 1110.

It should be noted that the signal used for controlling the first light-emitting control transistor T5 and the signal used for controlling the second light-emitting control transistor T6 can be different.

For example, as illustrated in FIG. 19, the first reset sub-circuit 1126 includes a first reset transistor T1, and the second reset sub-circuit 1127 includes a second reset transistor T7. The first electrode of the first reset transistor T1 is electrically connected with the first initialization voltage terminal Vinit1, the second electrode of the first reset transistor T1 is electrically connected with the node Nd1, and the gate electrode of the first reset transistor T1 is configured to receive the first reset control signal Re; the first electrode of the second reset transistor T7 is electrically connected with the second initialization voltage terminal Vinit2, the second electrode of the second reset transistor T7 is electrically connected with the first electrode E1 of the light-emitting element 1110, and the gate electrode of the second reset transistor T7 is configured to receive the second reset control signal Rst.

For example, the voltage value of the second initialization voltage at the second initialization voltage terminal Vinit2 is greater than the voltage value of the first initialization voltage at the first initialization voltage terminal Vinit1. By increasing the second initialization voltage at the second initialization voltage terminal Vinit2, the carriers in the interior of the light-emitting element 1110 are reset, the defects of carriers are reduced, the stability of the light-emitting element is increased, and the problem of screen flicker is further alleviated. However, the embodiments of the present disclosure are not limited to this case, and the voltage value of the second initialization voltage at the second initialization voltage terminal Vinit2 can be equal to the voltage value of the first initialization voltage at the first initialization voltage terminal Vinit1.

For example, the first reset transistor T1, the compensation transistor T2, the driving transistor T3, the data writing transistor T4, the first light-emitting control transistor T5, the second light-emitting control transistor T6, and the second reset transistor T7 are all poly-silicon thin film transistors, for example, low-temperature poly-silicon (LTPS) thin film transistors. The embodiments of the present disclosure are not limited thereto, and at least some of the first reset transistor T1, the compensation transistor T2, the driving transistor T3, the data writing transistor T4, the first light-emitting control transistor T5, the second light-emitting control transistor T6, and the second reset transistor T7 can also be oxide transistors.

For example, the first reset transistor T1, the compensation transistor T2, the driving transistor T3, the data writing transistor T4, the first light-emitting control transistor T5, the second light-emitting control transistor T6, and the second reset transistor T7 are all P-type transistors. However, the embodiments of the present disclosure are not limited to this case, and at least some of the first reset transistor T1, the compensation transistor T2, the driving transistor T3, the data writing transistor T4, the first light-emitting control transistor T5, the second light-emitting control transistor T6, and the second reset transistor T7 can also be N-type transistors.

For example, one of the voltage output from the voltage terminal VDD and the voltage output from the voltage terminal VSS is a high voltage, and the other of the voltage output from the voltage terminal VDD and the voltage output from the voltage terminal VSS is a low voltage. For example, in the embodiment illustrated in FIG. 19, the voltage output from the voltage terminal VDD is a constant positive voltage, while the voltage output from the voltage terminal VSS is a constant negative voltage. For example, in some exemplary embodiments, the voltage terminal VSS can be grounded.

For example, in practical applications, in the embodiments of the present disclosure, the second initialization voltage Vi2 output from the second initialization voltage terminal Vinit2 and the voltage Vss output from the voltage terminal VSS can satisfy the following formula: Vi2−Vss<VEL, so that the light-emitting element 1110 can be prevented from emitting light in a non-light-emitting stage. VEL refers to the light-emitting threshold voltage of the light-emitting element 1110.

It should be noted that in addition to the 7T1C (7 transistors and 1 capacitor) pixel circuit, the pixel circuit can also be a circuit with any other suitable structure, such as 7T2C, 8T2C, 9T2C, 6T1C, 6T2C or the like, and details will not be repeated here.

Figure 20:
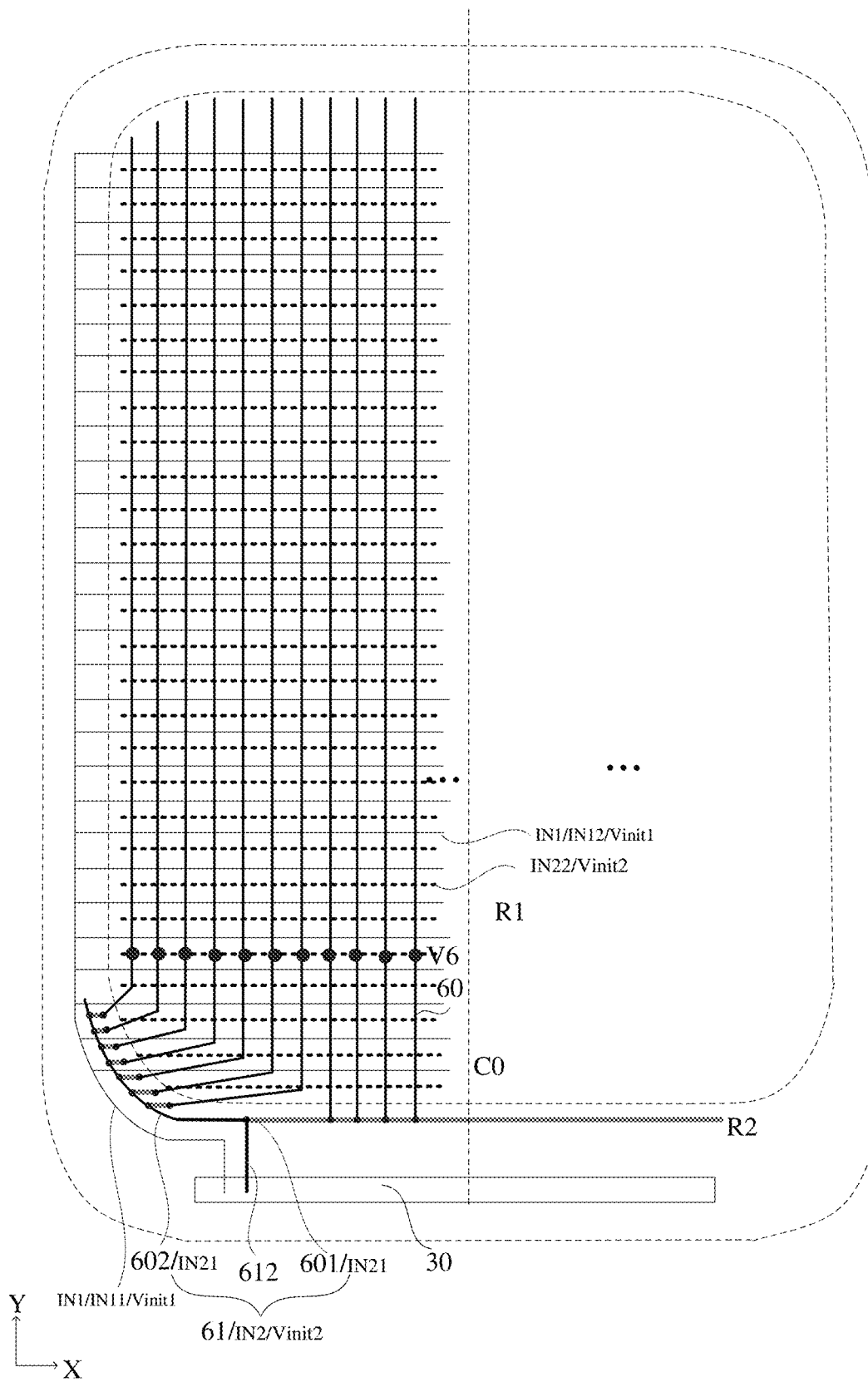
FIG. 20 is a schematic diagram of a display panel provided by an embodiment of the present disclosure.

FIG. 20 is a schematic diagram of a display panel provided by an embodiment of the present disclosure. As illustrated in FIG. 20, the display panel includes an initialization line IN1 and an initialization line IN2, the initialization line IN1 includes an initialization connection line IN11 and an initialization signal line IN12, and the initialization line IN2 includes an initialization connection line IN21 and an initialization signal line IN22. The initialization line IN1 is connected with the first initialization voltage terminal Vinit1, and the initialization line IN2 is connected with the second initialization voltage terminal Vinit2. The initialization line IN1 and the initialization line IN2 are insulated from each other.

As illustrated in FIG. 20, the display panel further includes a plurality of initialization signal lines IN22, and the initialization signal line IN22 is connected with the constant voltage line 60 through a via hole V6, so that the voltage on the constant voltage line 60 is the initialization voltage. The constant voltage line 60 is connected with the second initialization voltage terminal Vinit2. For the sake of clarity, FIG. 20 only illustrates via holes V6 in one row of sub-pixels. In each row of sub-pixels, via holes V6 can be provided, but it is not limited thereto.

As illustrated in FIG. 20, the first branch 601 and the second branch 602 form an initialization connection line IN21. In this case, the conductive bus 612 can be referred to as an initialization bus.

For example, referring to FIG. 19 and FIG. 20, the pixel circuit 1120 includes a driving transistor T3, a first reset transistor T1, and a second reset transistor T7. The first electrode of the first reset transistor T1 is connected with an initialization line IN1, the second electrode of the first reset transistor T1 is connected with the gate electrode of the driving transistor T3, and first reset transistor T1 is configured to reset the gate electrode of the driving transistor T3; the first electrode of the second reset transistor T7 is connected with a second initialization line IN2, the second electrode of the second reset transistor T7 is connected with the first electrode E1 of the light-emitting element 1110, and the second reset transistor T7 is configured to reset the first electrode E1 of the light-emitting element 1110.

For example, referring to FIG. 19 and FIG. 20, the pixel circuit 1120 includes a reset transistor, the first electrode of the reset transistor is connected with an initialization line, the second electrode of the reset transistor is connected with the first electrode of the light-emitting element 1110, the reset transistor is configured to reset the first electrode E1 of the light-emitting element 1110, and the constant voltage line 60 is an initialization line IN2.

Figure 21:
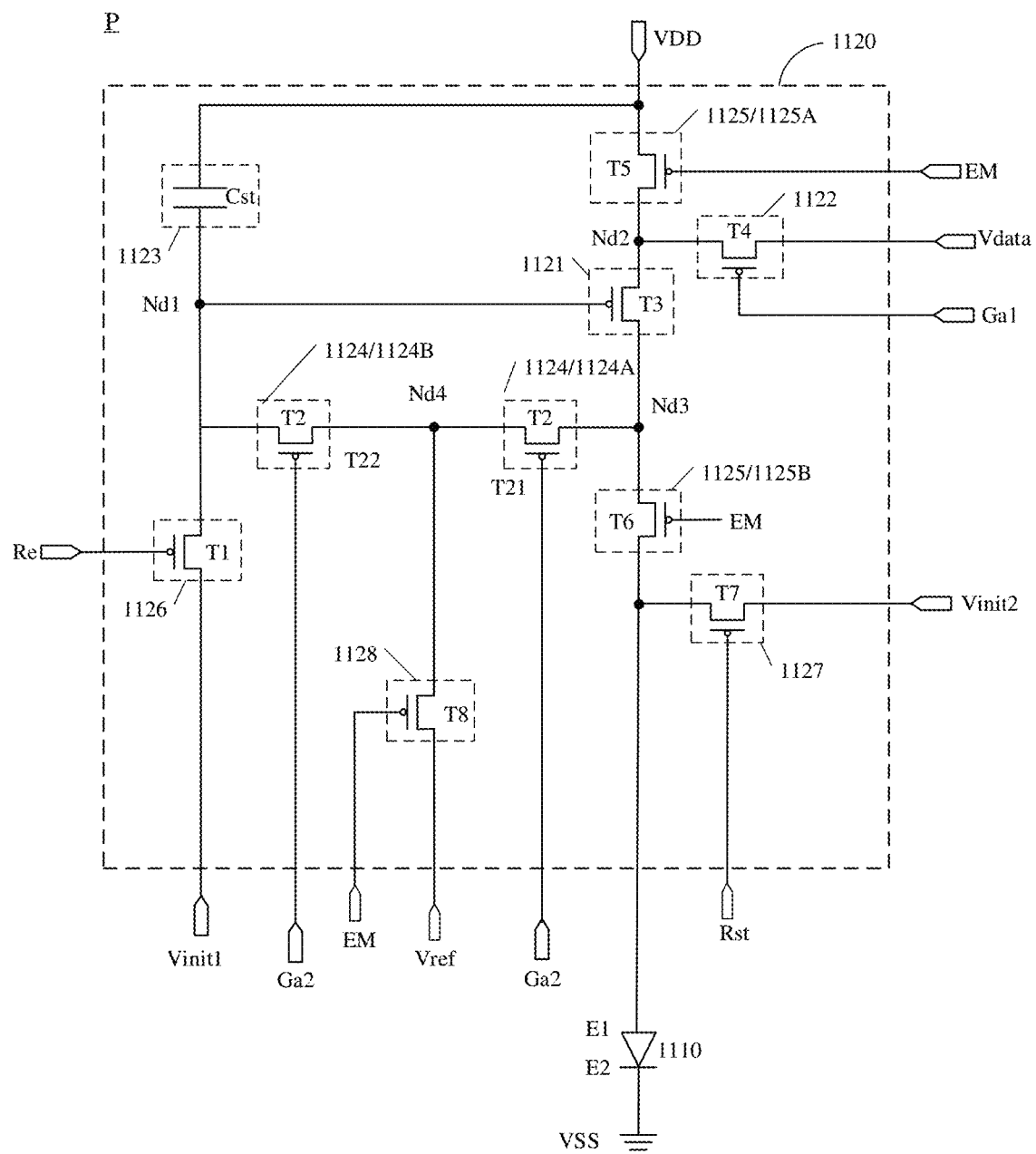
FIG. 21 is a schematic diagram of a pixel circuit and a light-emitting element of a sub-pixel in a display panel provided by some embodiments of the present disclosure.
Figure 22:
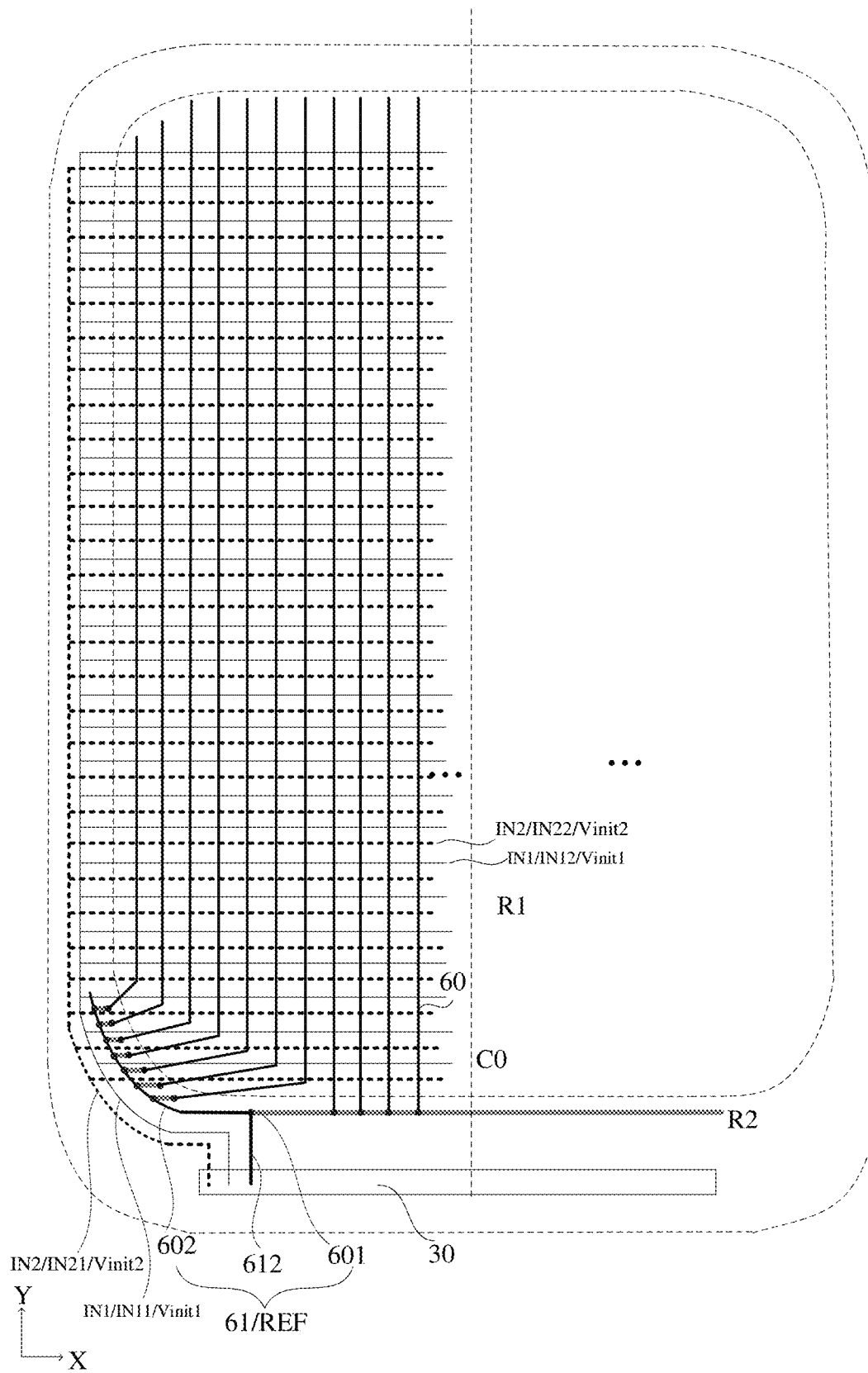
FIG. 22 is a schematic diagram of a display panel provided by an embodiment of the present disclosure.

FIG. 21 is a schematic diagram of a pixel circuit and a light-emitting element of a sub-pixel in a display panel provided by some embodiments of the present disclosure. FIG. 22 is a schematic diagram of a display panel provided by an embodiment of the present disclosure.

For example, as illustrated in FIG. 21, the compensation sub-circuit 1124 includes a first compensation sub-circuit 1124A and a second compensation sub-circuit 1124B. The first compensation sub-circuit 1124A and the second compensation sub-circuit 1124B are connected through an intermediate node Nd4.

For example, as illustrated in FIG. 21, the first compensation sub-circuit 1124A includes a first compensation sub-transistor T21, and the second compensation sub-circuit 1124B includes a second compensation sub-transistor T22. The second compensation sub-transistor T22 of the second compensation sub-circuit 1124B and the first compensation sub-transistor T21 of the first compensation sub-circuit 1124A are connected through the intermediate node Nd4 therebetween.

For example, as illustrated in FIG. 21, the pixel circuit 1120 further includes an anti-leakage sub-circuit 1128, and the anti-leakage sub-circuit 1128 is electrically connected with the node Nd4 and a reference voltage terminal Vref, respectively, and is configured to transmit the reference voltage to the node Nd4 in response to the light-emitting control signal EM. The reference voltage terminal Vref is configured to provide a reference voltage VRef to the pixel circuit, and for example, the reference voltage is a constant voltage. The anti-leakage sub-circuit 1128 can stabilize the voltage at the node Nd4, and further stabilize the voltage at the node Nd1, thereby preventing leakage and contributing to the stability of the driving current.

For example, as illustrated in FIG. 21, the anti-leakage sub-circuit 1128 includes an anti-leakage transistor T8, the gate electrode of the anti-leakage transistor T8 is configured to receive the light-emitting control signal EM, the first electrode of the anti-leakage transistor T8 is connected with a reference voltage line REF, and the second electrode of the anti-leakage transistor T8 is connected with the intermediate node Nd4.

For example, as illustrated in FIG. 22, the constant voltage line 60 is the reference voltage line REF. The reference voltage line REF is connected with the reference voltage terminal Vref.

For example, as illustrated in FIG. 21, the gate electrode of the compensation transistor T2 is configured to receive the compensation control signal Ga2, the first electrode of the compensation transistor T2 is connected with the gate electrode of the driving transistor T3, and the second electrode of the compensation transistor T2 is electrically connected with the second electrode of the driving transistor T3; the compensation transistor T2 includes a first compensation sub-transistor T21 and a second compensation sub-transistor T22 which are connected in series, and the first compensation sub-transistor T21 and the second compensation sub-transistor T22 are connected through the intermediate node Nd4 therebetween. The first electrode of the anti-leakage transistor T8 is connected with the reference voltage line REF, the second electrode of the anti-leakage transistor T8 is connected with the intermediate node Nd4, and the constant voltage line 60 is the reference voltage line REF.

As illustrated in FIG. 21 and FIG. 22, the display panel includes an initialization line IN1 and an initialization line IN2. As illustrated in FIG. 22, every two of the initialization line IN1, the initialization line IN2, and the constant voltage line 60 are insulated from each other. The initialization line IN1 is connected with the first initialization voltage terminal Vinit1, and the initialization line IN2 is connected with the second initialization voltage terminal Vinit2.

As illustrated in FIG. 21 and FIG. 22, the initialization line IN1 includes an initialization connection line IN11 and an initialization signal line IN12, and the initialization line IN2 includes an initialization connection line IN21 and an initialization signal line IN22. As illustrated in FIG. 20, a plurality of initialization signal lines IN12 are arranged in the second direction Y, and are connected with the initialization connection lines IN11, respectively. As illustrated in FIG. 20, a plurality of initialization signal lines IN22 are arranged in the second direction Y, and are connected with the initialization connection lines IN21, respectively.

As illustrated in FIG. 20, the plurality of initialization signal lines IN12 are arranged in the second direction Y, and are connected with the initialization connection lines IN11, respectively. As illustrated in FIG. 20, the plurality of initialization signal lines IN22 are arranged in the second direction Y, and are connected with the initialization connection lines IN21, respectively.

Figure 23:
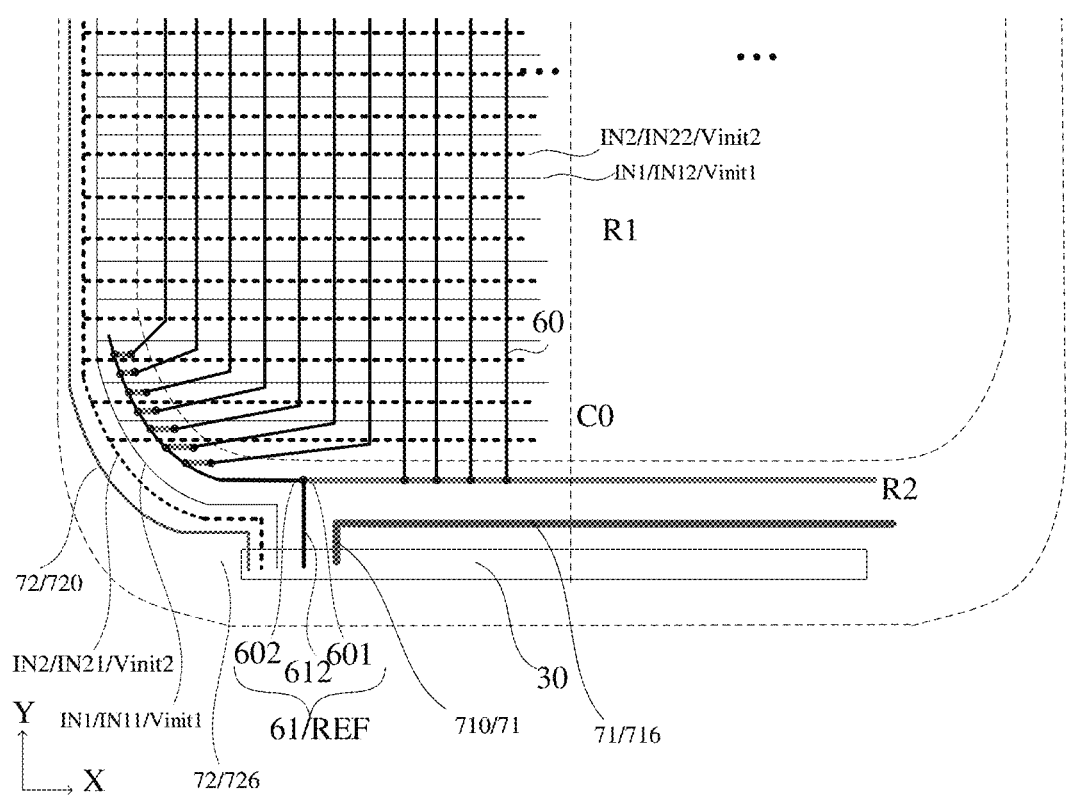
FIG. 23 is a schematic diagram of a display panel provided by an embodiment of the present disclosure.

FIG. 23 is a schematic diagram of a display panel provided by an embodiment of the present disclosure. FIG. 23 further illustrates a first power line 71 and a second power line 72. FIG. 23 does not illustrate the entire structure of the first power line 71, nor does it illustrate the entire structure of the second power line 72.

For example, the signal line can be connected with a flexible printed circuit board, and the integrated circuit is connected with the flexible printed circuit board, but it is not limited to this case.

In the embodiments of the present disclosure, the voltage terminal VDD provides a voltage Vdd (power voltage), the voltage terminal VSS provides a voltage Vss (power voltage), the first initialization voltage terminal Vinit provides a first initialization voltage Vi1, and the second initialization voltage terminal Vinit2 provides a second initialization voltage Vi2.

Figure 24:
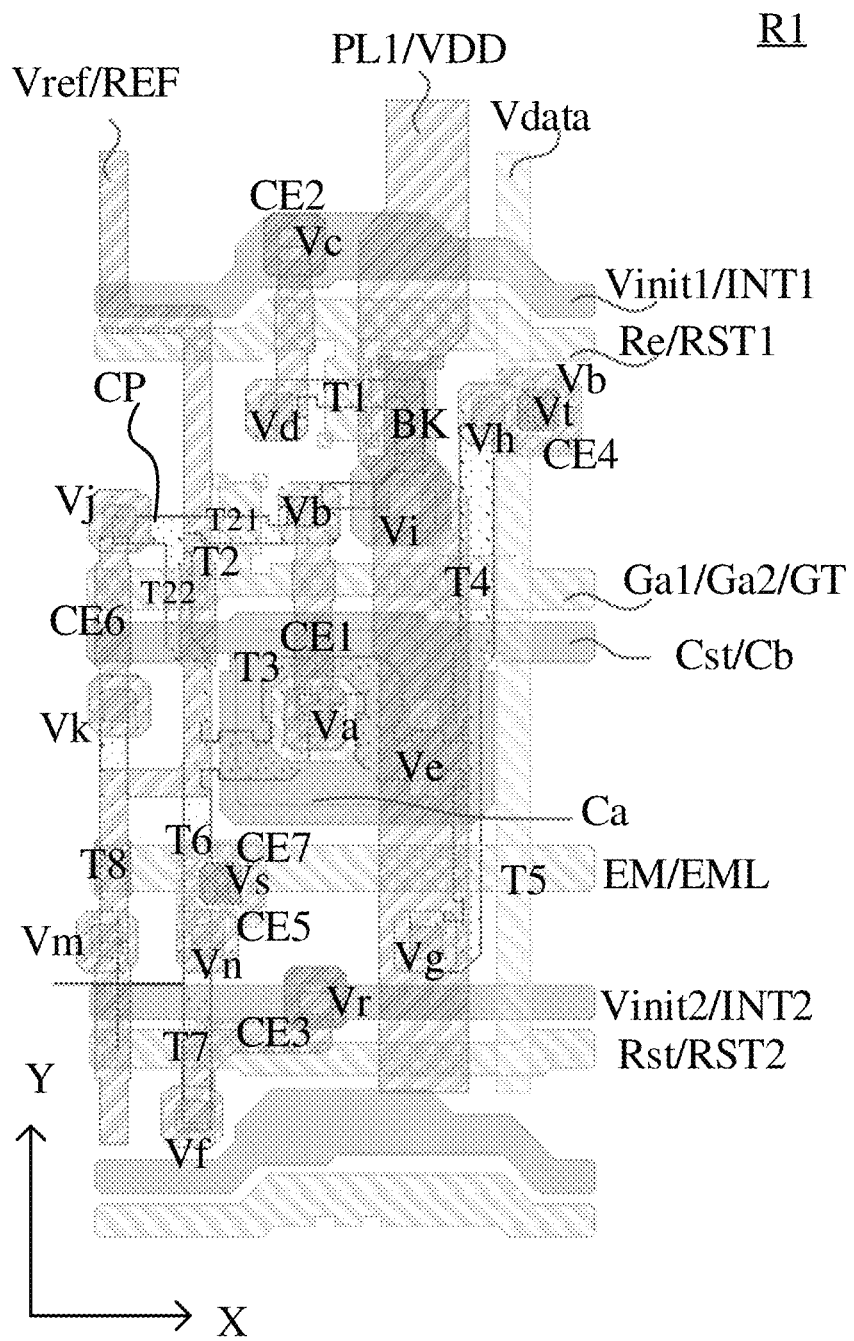
FIG. 24 is a layout diagram of a display panel provided by an embodiment of the present disclosure.
Figure 25:
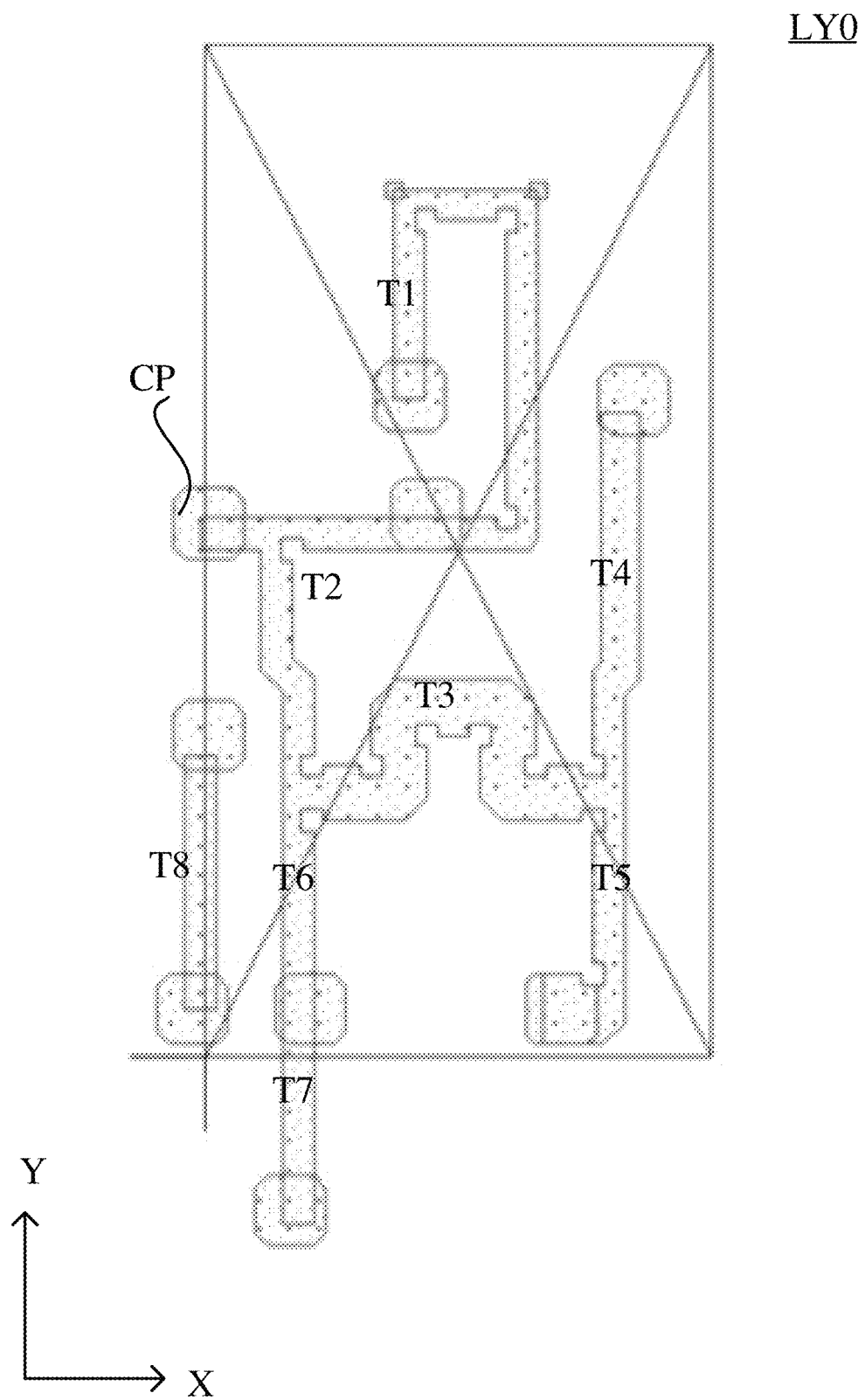
FIG. 25 is a plan view of an active layer LY0 in a display panel provided by an embodiment of the present disclosure.
Figure 26:
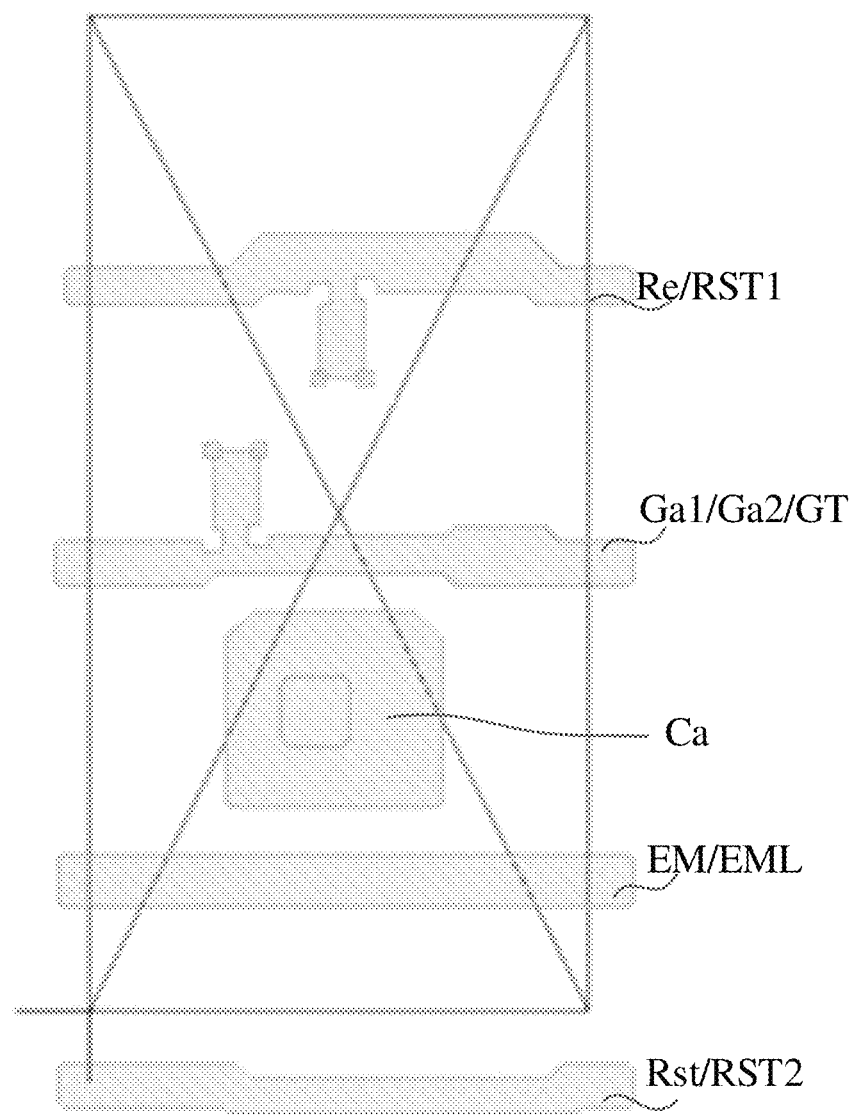
FIG. 26 is a plan view of a conductive layer LYa in a display panel provided by an embodiment of the present disclosure.
Figure 26:
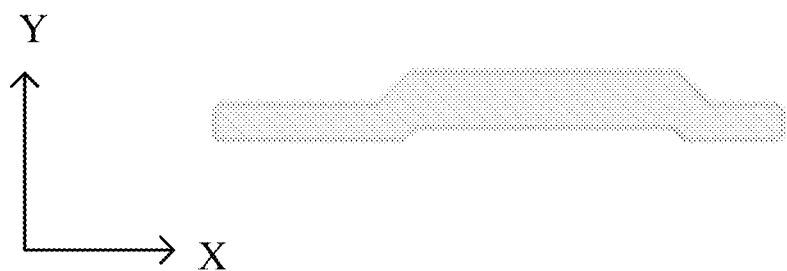
Figure 27:
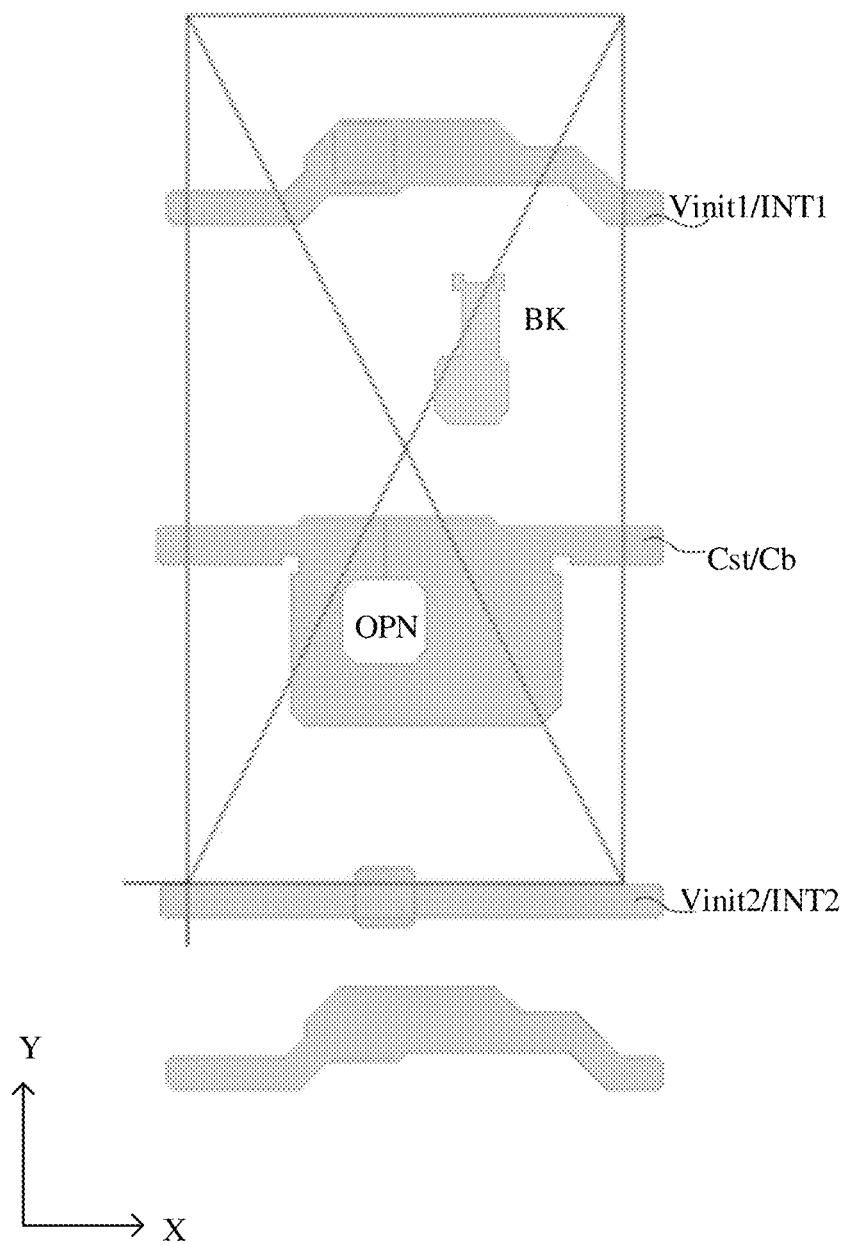
FIG. 27 is a plan view of a conductive layer LYb in a display panel provided by an embodiment of the present disclosure.
Figure 28:
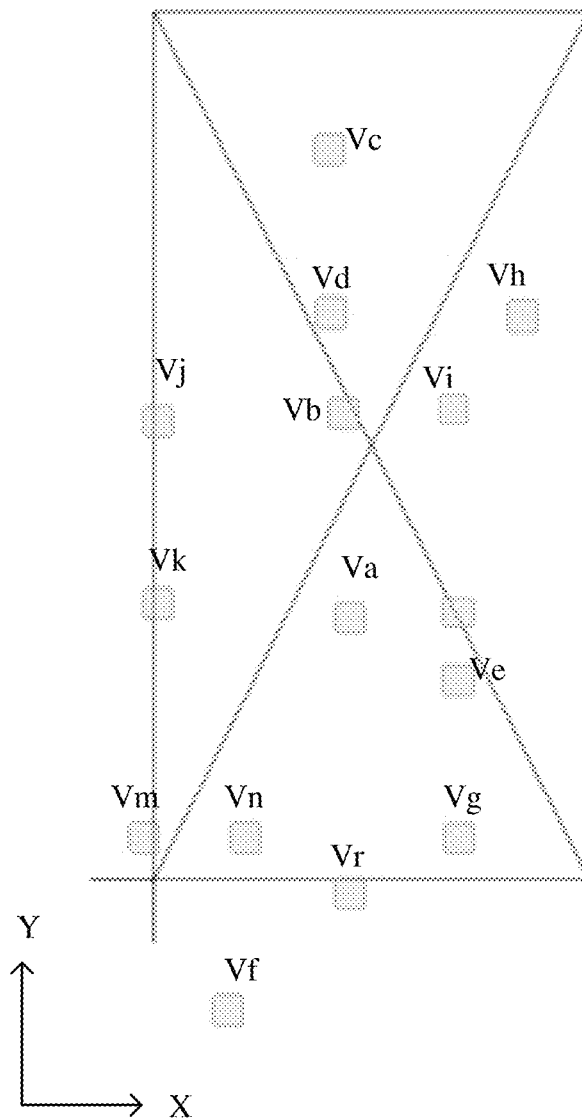
FIG. 28 is a plan view of a via hole VH1 penetrating an insulating layer in a display panel provided by an embodiment of the present disclosure.
Figure 29:
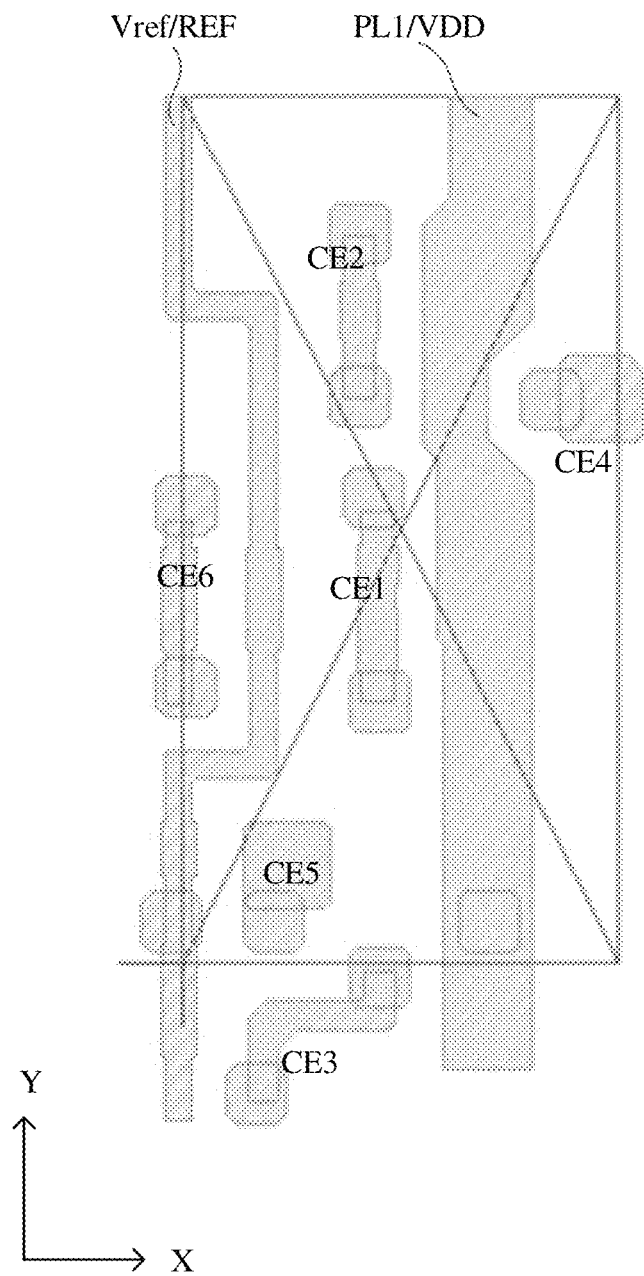
FIG. 29 is a plan view of a conductive layer LY1 in a display panel provided by an embodiment of the present disclosure.
Figure 30:
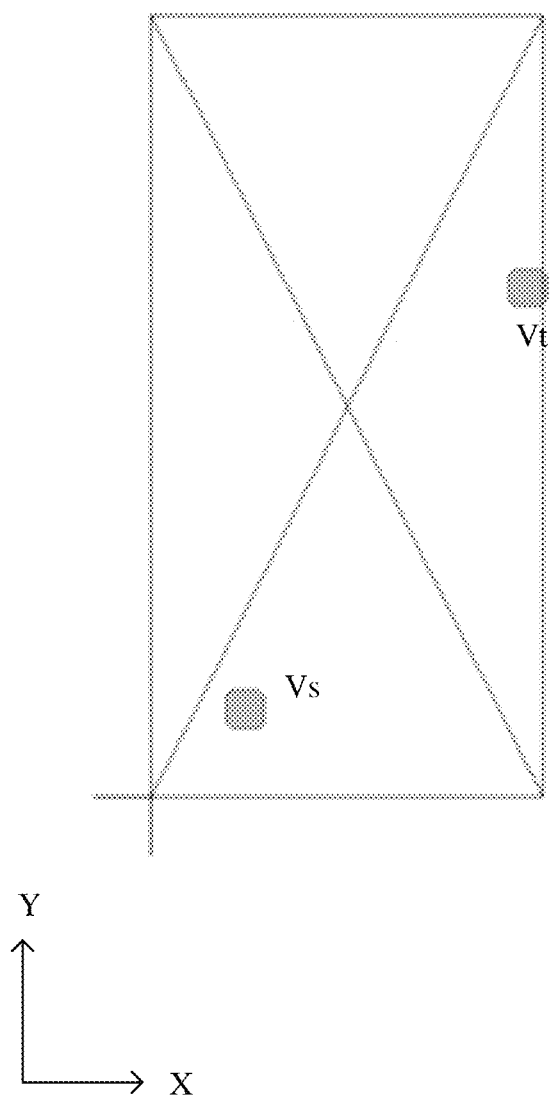
FIG. 30 is a plan view of a via hole VH2 penetrating an insulating layer in a display panel provided by an embodiment of the present disclosure.
Figure 31:
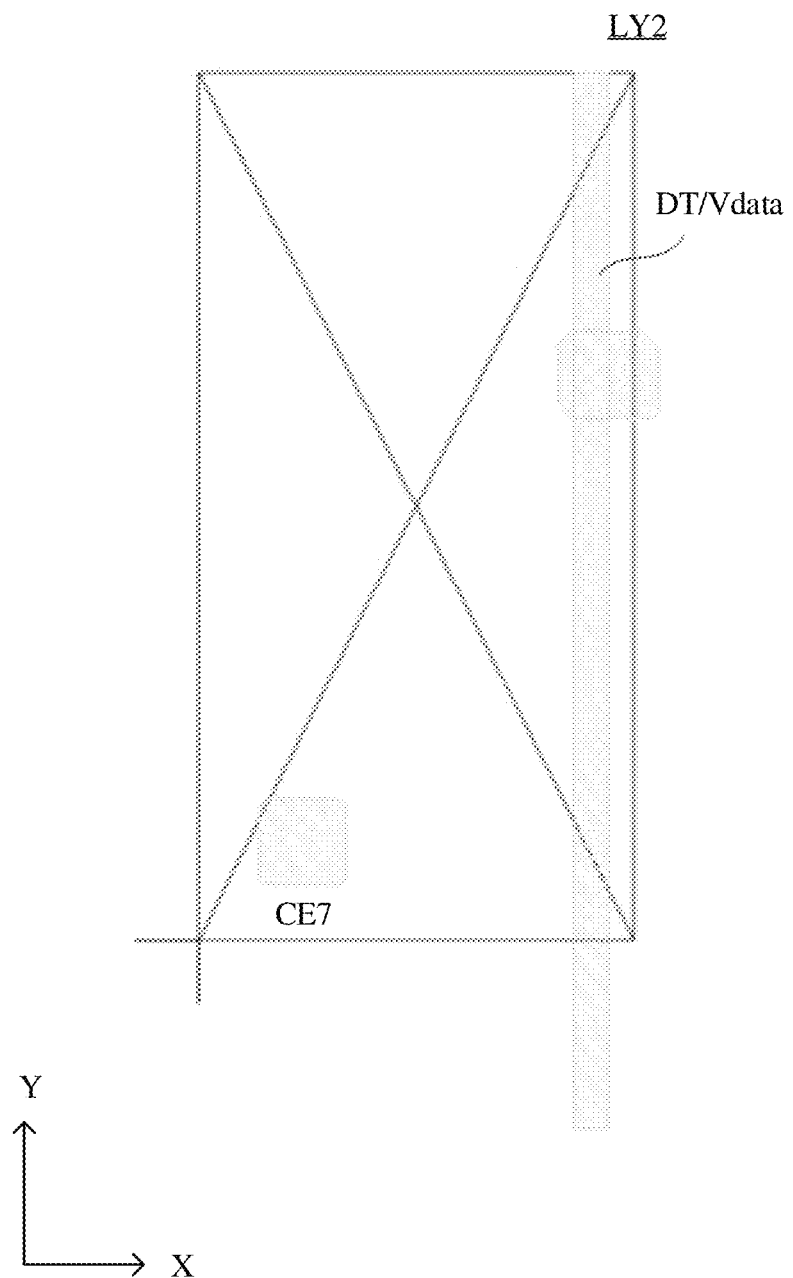
FIG. 31 is a plan view of a conductive layer LYb in a display panel provided by an embodiment of the present disclosure.

FIG. 24 is a layout diagram of a display panel provided by an embodiment of the present disclosure. FIG. 25 is a plan view of an active layer LY0 in a display panel provided by an embodiment of the present disclosure. FIG. 26 is a plan view of a conductive layer LYa in a display panel provided by an embodiment of the present disclosure. FIG. 27 is a plan view of a conductive layer LYb in a display panel provided by an embodiment of the present disclosure. FIG. 28 is a plan view of a via hole VH1 penetrating an insulating layer in a display panel provided by an embodiment of the present disclosure. FIG. 29 is a plan view of a conductive layer LY1 in a display panel provided by an embodiment of the present disclosure. FIG. 30 is a plan view of a via hole VH2 penetrating an insulating layer in a display panel provided by an embodiment of the present disclosure. FIG. 31 is a plan view of a conductive layer LYb in a display panel provided by an embodiment of the present disclosure.

As illustrated in FIG. 24 and FIG. 25, the active layer LY0 can be made of poly-silicon, and includes a semiconductor as a channel of a transistor and conductive portions located at both sides of the semiconductor, and the conductive portions are doped poly-silicon.

As illustrated in FIG. 24 and FIG. 26, the conductive layer LYa includes a reset control signal line RST1, a gate line GT, a first electrode-plate Ca of a storage capacitor, a light-emitting control signal line EML, and a reset control signal line RST2. The reset control signal line RST1 is configured to provide a first reset control signal Re, the gate line GT is configured to provide a scan signal Ga1 and a compensation control signal Ga2, the light-emitting control signal line EML is configured to provide a light-emitting control signal EM, and the reset control signal line RST2 is configured to provide a second reset control signal Rst.

As illustrated in FIG. 24 and FIG. 27, the conductive layer LYb includes an initialization signal line INT1, a block BK, a second electrode-plate Cb of the storage capacitor, and an initialization signal line INT2. The initialization signal line INT1 is connected with a first initialization voltage terminal Vinit1 to be configured to provide a first initialization voltage Vi1. The initialization signal line INT2 is connected with a second initialization voltage terminal Vinit2 to be configured to provide a second initialization voltage Vi2. FIG. 27 illustrates that the second electrode-plate Cb of the storage capacitor has an opening OPN.

As illustrated in FIG. 24 and FIG. 28, the via hole VH1 is a via hole that penetrates at least one of a first gate insulating layer, a second gate insulating layer, and an interlayer dielectric layer. The first gate insulating layer is located between the active layer LY0 and the conductive layer LYa, the second gate insulating layer is located between the conductive layer LYa and the conductive layer LYb, and the interlayer dielectric layer is located between the conductive layer LYb and the conductive layer LY1. FIG. 28 illustrates a via hole Va, a via hole Vb, a via hole Vc, a via hole Vd, a via hole Ve, a via hole Vf, a via hole Vg, a via hole Vh, a via hole Vi, a via hole Vj, a via hole Vk, a via hole Vm, a via hole Vn, and a via hole Vr.

As illustrated in FIG. 24 and FIG. 29, the conductive layer LY1 includes a reference voltage line REF, a first power voltage line PL1, a connection electrode CE1, a connection electrode CE2, a connection electrode CE3, a connection electrode CE4, a connection electrode CE5, and a connection electrode CE6. The reference voltage line REF is connected with a reference voltage terminal Vref to provide a reference voltage VRef, and the first power voltage line PL1 is connected with a voltage terminal VDD to provide a voltage Vdd (first power voltage).

As illustrated in FIG. 24 and FIG. 30, the via hole VH2 is a via hole penetrating the insulating layer between the conductive layer LY2 and the conductive layer LY1. FIG. 30 illustrates a via hole Vs and a via hole Vt.

As illustrated in FIG. 24 and FIG. 31, the conductive layer LY2 includes a connection electrode CE7 and a data signal line DT.

Referring to FIG. 21 and FIG. 24-FIG. 31, the reference voltage line REF is connected with the first electrode of the anti-leakage transistor T8 through the via hole Vm, the conductive portion CP is the intermediate node Nd4, the conductive portion CP is connected with one end of the connection electrode CE6 through the via hole Vj, and the other end of the connection electrode CE6 is connected with the second electrode of the anti-leakage transistor T8 through the via hole Vk.

Referring to FIG. 21 and FIG. 24-FIG. 31, one end of the connection electrode CE1 passes through the opening OPN of the second electrode-plate Cb of the storage capacitor Cst and is connected with the first electrode-plate Ca of the storage capacitor Cst (the gate electrode of the driving transistor T3) through the via hole Va, and the other end of the connection electrode CE1 is connected with the second electrode of the first reset transistor T1 through the via hole Vb.

Referring to FIG. 21 and FIG. 24-FIG. 31, one end of the connection electrode CE2 is connected with the first electrode of the first reset transistor T1 through the via hole Vd, and the other end of the connection electrode CE2 is connected with the initialization signal line INT1 through the via hole Vc.

Referring to FIG. 21 and FIG. 24-FIG. 31, one end of the connection electrode CE3 is connected with the first electrode of the second reset transistor T7 through the via hole Vf, and the other end of the connection electrode CE3 is connected with the initialization signal line INT2 through the via hole Vr.

Referring to FIG. 21 and FIG. 24-FIG. 31, one end of the connection electrode CE4 is connected with the first electrode of the data writing transistor T4 through the via hole Vh, and the other end of the connection electrode CE4 is connected with the data signal line DT through the via hole Vt.

Referring to FIG. 21 and FIG. 24-FIG. 31, one end of the connection electrode CE5 is connected with the second electrode of the second light-emitting control transistor T6 through the via hole Vn, and the other end of the connection electrode CE5 is connected with the connection electrode CE7 through the via hole VS. The first electrode E1 (not illustrated in FIG. 24) of the light-emitting element is connected with the connection electrode CE7.

Referring to FIG. 21 and FIG. 24-FIG. 31, the first power signal line PL1 is connected with the second electrode-plate Cb of the storage capacitor Cst through the via hole Ve, and the first power signal line PL1 is connected with the first electrode of the first light-emitting control transistor T5 through the via hole Vg.

Referring to FIG. 24-FIG. 31, the first power signal line PL1 is connected with the block BK through the via hole Vi.

For example, the first power signal line PL1 is the first power signal line 718. For example, the initialization signal line INT1 is the initialization signal line IN1. For example, the initialization signal line INT2 is the initialization signal line IN2.

FIG. 24 illustrates the first compensation sub-transistor T21 and the second compensation sub-transistor T22.

Of course, as illustrated in FIG. 19, the display panel provided by the embodiments of the present disclosure may not include the anti-leakage transistor T8 or the reference voltage line REF connected thereto. In this case, the active portion (the channel region, and the first and second electrodes located at both sides of the channel region) of the anti-leakage transistor T8, the reference voltage line REF, and the connection electrode CE6 in the layout of FIG. 24 can be removed, and then the pixel circuit illustrated in FIG. 19 can be obtained.

In the embodiments of the present disclosure, the conductive layer LYa, the conductive layer LYb, the conductive layer LY1, and the conductive layer LY2 can be made of a conductive material, such as a metal material. For example, the material of at least one of the conductive layer LYa and the conductive layer LYb includes molybdenum, nickel, molybdenum alloy, nickel alloy, etc., without being limited in the embodiments of the present disclosure. The material of at least one of the conductive layer LY1 and the conductive layer LY2 includes titanium, titanium alloy, aluminum, aluminum alloy, copper, copper alloy or any other suitable composite material, without being limited in the embodiments of the present disclosure.

For example, the first power line 71 and the second power line 72 are made of a metal material.

For example, the base substrate can be a glass substrate or a polyimide substrate, but not limited thereto, and can be selected as needed. For example, the insulating layer 501, the insulating layer 502, the passivation layer PVX, and the planarization layer PLN are all made of insulating materials.

For example, the materials of the first electrode E1 and the second electrode E2 of the light-emitting element can be selected as needed. In some embodiments, the first electrode E1 can adopt at least one of a transparent conductive metal oxide and silver, but is not limited thereto. For example, the transparent conductive metal oxide includes indium tin oxide (ITO), but is not limited thereto. For example, the first electrode E1 can adopt a structure in which three sub-layers ITO-Ag-ITO are stacked. In some embodiments, the second electrode E2 can adopt a metal with a low work function, and at least one of magnesium and silver can be adopted, but it is not limited thereto.

The embodiments of the present disclosure provide a design manner of static level lines in a display panel, a distribution manner of the static level lines, and a suitable distribution space for the static level lines. The static level lines are vertical lines, that is, lines extending in the second direction Y.

In the embodiments of the present disclosure, the elements located in the same layer can be formed by the same film layer through the same patterning process. For example, the elements located in the same layer may be located on the surface of the same element away from the base substrate.

It should be noted that, for the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching step, or may include other processes for forming predetermined patterns such as printing and ink-jetting. The photolithography process refers to the process including film formation, exposure, development, etc., by using photoresist, mask plate, exposure machine, etc. to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily conceive of changes or substitutions within the technical scope disclosed in the present disclosure, and these changes or substitutions should be covered within the protection scope of the present disclosure. Therefore, the protection scope of the present disclosure should be subject to the protection scope of the claims.

The invention claimed is:

1. A display panel, comprising:
a base substrate, comprising a display region and a peripheral region, wherein the peripheral region is located on at least one side of the display region;
a plurality of sub-pixels, located in the display region;
a plurality of constant voltage lines, arranged in a first direction, wherein each of the plurality of constant voltage lines extends in a second direction, the constant voltage line is at least partially located in the display region, and the first direction intersects with the second direction; and
a conductive line, located in the peripheral region, and connected with the plurality of constant voltage lines,
wherein the plurality of constant voltage lines are configured to provide a constant voltage to the plurality of sub-pixels,
wherein the conductive line comprises a conductive bus, at least a part of the conductive bus extends in the second direction, wherein the conductive line further comprises a first branch and a second branch that are connected with the conductive bus, respectively,
wherein the first branch and the second branch are located on both sides of the conductive bus, respectively, and the first branch, the second branch, and the conductive bus are connected to a same point.

2. The display panel according to claim 1, wherein each of the plurality of sub-pixels comprises a pixel circuit and a light-emitting element, the pixel circuit is configured to drive the light-emitting element, and the pixel circuit comprises a driving transistor, a first reset transistor, and a second reset transistor, a first electrode of the first reset transistor is connected with a first initialization line, a second electrode of the first reset transistor is connected with a gate electrode of the driving transistor, and the first reset transistor is configured to reset the gate electrode of the driving transistor, a first electrode of the second reset transistor is connected with a second initialization line, a second electrode of the second reset transistor is connected with a first electrode of the light-emitting element, and the second reset transistor is configured to reset the first electrode of the light-emitting element.

3. The display panel according to claim 2, further comprising an initialization signal line, wherein the initialization signal line extends in the first direction, the constant voltage line is connected with the initialization signal line, and the second initialization line comprises the initialization signal line and the constant voltage line which are connected with each other.

4. A display panel, comprising:
a base substrate, comprising a display region and a peripheral region, wherein the peripheral region is located on at least one side of the display region;
a plurality of sub-pixels, located in the display region;
a plurality of constant voltage lines, arranged in a first direction, wherein each of the plurality of constant voltage lines extends in a second direction, the constant voltage line is at least partially located in the display region, and the first direction intersects with the second direction; and
a conductive line, located in the peripheral region, and connected with the plurality of constant voltage lines,
wherein the plurality of constant voltage lines are configured to provide a constant voltage to the plurality of sub-pixels,
wherein each of the plurality of sub-pixels comprises a pixel circuit and a light-emitting element, the pixel circuit is configured to drive the light-emitting element, and the pixel circuit comprises a driving transistor, a first reset transistor, and a second reset transistor,
a first electrode of the first reset transistor is connected with a first initialization line, a second electrode of the first reset transistor is connected with a gate electrode of the driving transistor, and the first reset transistor is configured to reset the gate electrode of the driving transistor,
a first electrode of the second reset transistor is connected with a second initialization line, a second electrode of the second reset transistor is connected with a first electrode of the light-emitting element, and the second reset transistor is configured to reset the first electrode of the light-emitting element,
wherein the pixel circuit comprises a compensation transistor and an anti-leakage transistor,
a gate electrode of the compensation transistor is configured to receive a compensation control signal, a first electrode of the compensation transistor is connected with the gate electrode of the driving transistor, and a second electrode of the compensation transistor is electrically connected with a second electrode of the driving transistor;

the compensation transistor comprises a first compensation sub-transistor and a second compensation sub-transistor which are connected in series, and the first compensation sub-transistor and the second compensation sub-transistor are connected through an intermediate node therebetween;

a first electrode of the anti-leakage transistor is connected with a reference voltage line, and a second electrode of the anti-leakage transistor is connected with the intermediate node, and the constant voltage line is the reference voltage line.

5. The display panel according to claim 4, further comprising a first power line, wherein the first power line is configured to provide a constant first power voltage to the plurality of sub-pixels, the first power line comprises a first power bus, the first power bus is located in the peripheral region, and at least a part of the first power bus extends in the second direction.

6. The display panel according to claim 5, further comprising a second power line, wherein the second power line is configured to provide a constant second power voltage to the plurality of sub-pixels, the second power line comprises a second power bus, the second power bus is located in the peripheral region, and at least a part of the second power bus extends in the second direction.

7. The display panel according to claim 6, wherein the conductive line comprises a conductive bus, at least a part of the conductive bus extends in the second direction, and the at least a part of the conductive bus extending in the second direction is located between the at least a part of the first power bus extending in the second direction and the at least a part of the second power bus extending in the second direction.

8. The display panel according to claim 6, further comprising an integrated circuit, wherein the conductive bus, the first power bus, and the second power bus are all connected with the integrated circuit.

9. The display panel according to claim 5, wherein the conductive line comprises a first branch and a second branch that are connected with the conductive bus, respectively, the first power line comprises a first power connection line, the first power connection line extends in the first direction, and an orthographic projection of the first power connection line on the base substrate overlaps with an orthographic projection of the first branch on the base substrate.

10. The display panel according to claim 9, further comprising a planarization layer, wherein the planarization layer is located at one side of the first branch close to the base substrate, the first branch has a plurality of openings, and each of the plurality of openings is configured to expose a part of the planarization layer.

11. The display panel according to claim 10, wherein a material of the planarization layer comprises an organic material.

12. The display panel according to claim 9, wherein the first branch extends in the first direction, an included angle between the second branch and the first branch is an obtuse angle, and an included angle between the second branch and the conductive bus is an obtuse angle.

13. The display panel according to claim 12, wherein a shape of the second branch comprises at least one of an arc, a curve, or a fold line.

14. The display panel according to claim 9, further comprising a plurality of conductive connection lines, wherein the second branch is connected with the plurality of conductive connection lines, and part of the plurality of constant voltage lines are connected with the plurality of conductive connection lines, respectively.

15. The display panel according to claim 14, further comprising a plurality of signal connection lines, wherein an orthographic projection of at least a part of the plurality of signal connection lines on the base substrate overlaps with an orthographic projection of the second branch on the base substrate.

16. The display panel according to claim 15, wherein at least one signal connection line of the plurality of signal connection lines is arranged between two adjacent conductive connection lines.

17. The display panel according to claim 16, wherein each of the plurality of signal connection lines comprises at least one of a clock signal line, a start input signal line of a shift register, a low-level signal line, or a high-level signal line.

18. The display panel according to claim 9, wherein the plurality of constant voltage lines, at least a part of the conductive bus, and the second branch are located in a same layer, and the first branch is located in another layer.

19. The display panel according to claim 4, wherein each of the plurality of sub-pixels comprises a pixel circuit and a light-emitting element, the pixel circuit is configured to drive the light-emitting element, the pixel circuit comprises a reset transistor, a first electrode of the reset transistor is connected with an initialization line, a second electrode of the reset transistor is connected with a first electrode of the light-emitting element, the reset transistor is configured to reset the first electrode of the light-emitting element, and the constant voltage line is the initialization line.

20. A display device, comprising the display panel according to claim 4.

* * * * *